United States Patent
Kojima et al.

(10) Patent No.: US 8,569,087 B2
(45) Date of Patent: Oct. 29, 2013

(54) METHOD FOR MANUFACTURING ORGANIC ELECTRONIC ELEMENT

(75) Inventors: Shigeru Kojima, Hachioji (JP);
Kunimasa Hiyama, Hachioji (JP);
Hideo Taka, Inagi (JP)

(73) Assignee: Konica Minolta Holdings, Inc. (JP)

( * ) Notice: Subject to any disclaimer, the term of this patent is extended or adjusted under 35 U.S.C. 154(b) by 70 days.

(21) Appl. No.: 12/741,704

(22) PCT Filed: Nov. 11, 2008

(86) PCT No.: PCT/JP2008/070470
§ 371 (c)(1),
(2), (4) Date: May 6, 2010

(87) PCT Pub. No.: WO2009/063850
PCT Pub. Date: May 22, 2009

(65) Prior Publication Data
US 2010/0267180 A1  Oct. 21, 2010

(30) Foreign Application Priority Data
Nov. 12, 2007  (JP) .................................. 2007-293020

(51) Int. Cl.
*H01L 21/00* (2006.01)
*H01L 21/40* (2006.01)

(52) U.S. Cl.
USPC .................. 438/46; 438/99; 257/E51.018

(58) Field of Classification Search
USPC ................. 438/82, 99, 562, 623, 725, 22–47, 438/FOR. 157; 257/E51.012, E51.018
See application file for complete search history.

(56) References Cited

U.S. PATENT DOCUMENTS

| | | | |
|---|---|---|---|
| 2004/0207312 A1* | 10/2004 | Takashima et al. | 313/503 |
| 2005/0084231 A1* | 4/2005 | Araki et al. | 385/147 |
| 2006/0223221 A1 | 10/2006 | Ishii | |
| 2007/0087489 A1* | 4/2007 | Park et al. | 438/149 |
| 2008/0105875 A1* | 5/2008 | Maekawa et al. | 257/72 |
| 2008/0129192 A1* | 6/2008 | Watanabe et al. | 313/504 |
| 2009/0074974 A1* | 3/2009 | Yokoi et al. | 427/335 |

FOREIGN PATENT DOCUMENTS

| | | | |
|---|---|---|---|
| CN | 1525800 A | | 9/2004 |
| JP | 2001-284045 A | | 10/2001 |
| JP | 2002-216956 A | | 8/2002 |
| JP | 2002216956 A | * | 8/2002 |
| JP | 2004-165512 A | | 6/2004 |
| JP | 2004-247279 A | | 9/2004 |
| JP | 2004-265672 A | | 9/2004 |
| JP | 2006-278101 A | | 10/2006 |
| JP | 2006-278585 A | | 10/2006 |
| JP | 1841703 A | | 10/2006 |
| JP | 2007-95782 A | | 4/2007 |
| JP | 2007-116008 A | | 5/2007 |
| KR | 10-2006-0105495 A | | 10/2006 |
| TW | 228381 B | | 2/2005 |
| WO | 2007/114244 A1 | | 10/2007 |

OTHER PUBLICATIONS

International Search Report for PCT/JP2008/070470 mailed Jan. 27, 2009 with English translation.

* cited by examiner

*Primary Examiner* — Calvin Choi

(74) *Attorney, Agent, or Firm* — Cantor Colburn LLP

(57) ABSTRACT

Provided is a manufacturing method by which each functional layer of various types of organic electronic elements can be uniformly formed by wet process. Specifically, a method for manufacturing an organic electronic element which uniformly emits light with high emission efficiency is provided. The method for manufacturing the organic electronic element includes a step of forming a functional layer by laminating at least an organic layer (A) and an organic layer (B) in this order on a substrate. After forming at least the organic layer (A), the organic layer (B) is applied and formed on the organic layer (A) by using a fluorine-containing solvent.

10 Claims, No Drawings

METHOD FOR MANUFACTURING ORGANIC ELECTRONIC ELEMENT

CROSS REFERENCE TO RELATED APPLICATIONS

This is a U.S. national stage application of International Application No. PCT/JP2008/070470, filed on 11 Nov. 2008. Priority under 35 U.S.C. §119(a) and 35 U.S.C. §365(b) is claimed from Japanese Application No. JP2007-293020, filed 12 Nov. 2007, the disclosure of which is also incorporated herein by reference.

TECHNICAL FIELD

The present invention relates to a manufacturing method of an organic electronic element in which an organic electronic element functional layer is formed with a coating method application.

BACKGROUND

In recent years, there have been developed various kinds of organic electronic elements such as an organic electroluminescence element, an organic photoelectric conversion element, an organic photoreceptor for electrophotography, and an organic transistor.

An organic electronic element is an element which performs an electric job using an organic substance. This element is expected to exhibit the merits, such as energy saving, low cost, and flexibility, and this element is directed attention as a technique which will replace the conventional inorganic semiconductor using silicon.

These organic electronic elements are elements which emit light, control an electric current and voltage, generate electricity or keep the charge by irradiating with a light, by leading an electric current through a very thin membrane made of an organic substance through an electrode.

The electroluminescence element (hereafter it is called as an EL element), which is one of the electronic elements, consumes only a small amount of electric power. There has been increased a need for a surface light element with a volume small, and it is paid attention as one of such surface light elements. And these EL elements are divided roughly into an inorganic EL element and an organic EL element by the material to be used.

An inorganic EL element generally gives a high electric field at a light emitting portion, and an electron is accelerated in this high electric field to collide with a luminescence center, thereby a luminescence center is exited, from which light is emitted. On the other hand, an organic EL element injects an electron and a hole into a light emitting layer from an electron injection electrode and a hole injection electrode, respectively. The, both of the injected electron and hole are combined in the light emitting layer to making an organic material into an excited state.

When this organic material returns from an excited state to a ground state, light is emitted. Compared with an inorganic EL element, there is an advantage that an organic EL element can be driven with a low voltage. Taking advantage of the merit that an organic EL element emits light on a plane, the development as a thin and flexible illumination application is expected.

In particular, in the field of the organic EL element for illumination, efficiently manufacturing a high efficient element is expected.

As a way of increasing the efficiency of an organic EL element, the method of using a phosphorescence emitting compound is known. It is possible that a phosphorescence emitting compound emits light with higher efficiency than conventional fluorescence emitting compound.

It is especially important that a phosphorescence luminescence emitting compound is used in a laminated structure. Still higher efficiency can be obtained by laminating various functional layers such as a positive hole transport layer, a light emitting layer, and an electron transport layer.

Moreover, an organic photoelectric conversion element is an electronic element having a similar structure as the above-mentioned organic electroluminescence element. It is an element having a structure in which a light emitting layer in an organic E1 element is changed with an electricity generating layer composed of a thin layer of an organic compound, and the electricity generating layer is sandwiched between electrodes. Electric power is generated when a light is irradiated thereon. Therefore, when the organic photoelectric conversion element of a thin film is used as a solar cell, a miniaturization and a weight saving will be easy, and also it will become a solar cell which can obtain a stabilized output even under the low illumination ambient or the elevated-temperature ambient compared with the solar cells of the existing inorganic semiconductor system.

Also in an organic photoelectric conversion element, like an organic EL element, a carrier trap will be formed in an electricity generating layer by the effect of water and oxygen, and concentration of the carrier which is generated by charge separation will be prevented. As a result, this will lead to not only decline in generation efficiency, but it will decrease the lifetime of an element. Therefore, in the organic photoelectric conversion element, similarly as in an organic EL element, it has been investigated the ways to secure the performance of the element by using the sealing material which has barrier property to gas constituents, such as water and oxygen, as is described in Patent document 4.

On the other hand, a wet process is paid attention as a production method which enables to produce a variety of constituting organic layers of the aforesaid organic EL element and organic photoelectron converting element with high manufacturing efficiency. In the conventional vacuum deposition method, large-sized vacuum devices are needed, and at the same time, it was required time for the operation to achieve vacuum of a substrate and the vacuum evaporation process, and the utilization efficiency of material was also low.

About formation of the functional layers by a wet process, there was proposed a coating method of a solution in which materials having a low solubility or a polymer is dissolved in a fluorine-containing solvent (for example, refer to Patent documents 1 and 2).

However, for example, when a high efficient organic EL element is intended to form using a phosphorescence luminescence compound by a wet process, during the process of laminating a functional layer, there is a problem that the underlaying layer may be dissolved at the time of the upper layer application.

As a way of dealing with such a problem, there is known a method of applying an upper layer using a solvent which does not easily dissolve the underlaying layer. For example, since a light emitting layer is hardly dissolved into a polar solvent, there was proposed a method of applying the electron transport layer which is located an upper layer with a polar solvent (for example, refer to Patent document 3).

However, when an organic EL element of a large area suitable for an illumination application is intended to produce, and the organic layer (electron transportation layer) is applied on the light emission layer using a polar solvent such as alcohol, it was found that an emission unevenness may be produced.

Moreover, compared with the case in which the same electron transport layer is vapor-deposited, it was also found that efficiency was deteriorated greatly.

Patent document 1: JP-A No. 2002-216956
Patent document 2: JP-A No. 2004-265672
Patent document 3: JP-A No. 2007-116008
Patent document 4: JP-A No. 2004-165512

DISCLOSURE OF THE INVENTION

The Problems to be Solved by the Invention

Therefore, an object of the present invention is to provide a production method which can form uniformly each functional layer of various organic electronic elements by using a wet process.

The Means to Solve the Problems

The above-mentioned problems of the present invention can be solved by the following means.
1. A method for producing an organic electronic element comprising the step of:
    forming functional layers by laminating an organic layer A on a substrate followed by laminating an organic layer B on the organic layer A,
    wherein the organic layer B is formed by coating using a fluorine containing solvent after the organic layer A is formed.
2. The method for producing an organic electronic element of the aforesaid item 1,
    wherein the organic layer A is a light emitting layer.
3. The method for producing an organic electronic element of the aforesaid item 2,
    wherein the light emitting layer is formed by coating using a non-polar solvent.
4. The method for producing an organic electronic element of any one of the aforesaid items 1 to 3,
    wherein the organic layer B is an electron transport layer.
5. The method for producing an organic electronic element of any one of the aforesaid items 2 to 4,
    wherein the light emitting layer contains a phosphorescence emitting compound.
6. The method for producing an organic electronic element of any one of the aforesaid items 2 to 5,
    wherein the light emitting layer contains a compound having a low molecular weight.
7. The method for producing an organic electronic element of any one of the aforesaid items 1 to 6,
    wherein the fluorine containing solvent is a fluorine containing alcohol.
8. The method for producing an organic electronic element of any one of the aforesaid items 1 to 7,
    wherein the fluorine containing solvent is used by mixing with a polar solvent containing no fluorine atom.
9. The method for producing an organic electronic element of any one of the aforesaid items 1 to 8,
    wherein at least one cross-linked organic layer is provided prior to coating the organic layer B using a fluorine containing solvent.
10. The method for producing an organic electronic element of any one of the aforesaid items 1 to 9,
    wherein a metal layer or a metal compound layer is laminated on the organic layer B formed by coating using a fluorine containing solvent.
11. The method for producing an organic electronic element of the aforesaid item 1,
    wherein the organic electronic element is a photoelectric conversion element, and the organic layer A is a bulk hetero junction layer.
12. The method for producing an organic electronic element of the aforesaid item 11,
    wherein the bulk hetero junction layer is formed by coating using a non-polar solvent.
13. The method for producing an organic electronic element of the aforesaid items 11 or 12,
    wherein the organic layer B is an electron transport layer.
14. The method for producing an organic electronic element of any one of the aforesaid items 11 to 13,
    wherein the organic layer B contains a compound having a carboline ring or a carbazole ring.

Effects of the Invention

By the present invention, it is possible to form functional layers of various organic electronic elements uniformly by using a wet process (the coating method).

Especially, the present invention has achieved to provide an organic electroluminescence element exhibiting uniform luminescence with high emission efficiency.

BEST MODE TO CARRY OUT THE INVENTION

The best mode to carry out the present invention is described below in details.

In an organic EL, in order to make phosphorescence luminescence material emit light at high efficiency, it is known that high efficiency will be obtained when the organic EL element is produced by laminating separately each functional layer, such as a positive hole transport layer, a light emitting layer, and an electron transport layer. Moreover, also in an organic photoelectric conversion element, it is known that high efficiency will be obtained when photoelectric conversion element is produced by laminating separately each functional layer, such as a positive hole transport layer, an electricity generating layer, and an electron transport layer.

In addition, there is paid attention to the manufacturing process of the organic electronic element using a wet process including a coating process, an ink-jet method, or a printing method from the viewpoint of high utilization efficiency of materials.

However, when a functional layer is going to be laminated by a wet process, dissolution of the underlaying layer becomes a problem. When the underlaying layer is dissolved out, the merit achieved by the aforesaid lamination of the functional layers will be lost, and at the same time, there will occur the problem that an organic electronic element will exhibit short-circuits induced by decrease of uniformity in film thickness or will increase deterioration caused by centralization of an electric field.

The following way is known as a way of coping with such a problem. It is the way of coating an upper layer using a solvent which does not easily dissolve an underlaying layer when the upper functional layer is laminated on the prescribed organic compound layer formed on the substrate during the time of laminating each layer of an organic electronic element. For example, since the light emitting layer of an organic electroluminescence element will be easily dissolved into a non-polar solvent like toluene and it is hardly dissolved into a polar solvent, there was proposed a way of coating an electron transport layer which becomes an upper layer of the light emitting layer with a polar solvent such as alcohol.

However, when an organic electroluminescence element having a large area was produced by coating an organic layer using a typical and common polar solvent alcohol on a light emitting layer, it was found out that emission unevenness will occur. Moreover, it was also found out that efficiency of the element will be greatly deteriorated compared with the element produced by vacuum evaporation of the same electron transport layer.

The present inventors have repeated study about the coating solvent to produce the element having a large area. As a result, when applying other functional layer on an organic layer (for example, when applying an electron transport layer on a light emission layer), it was found that a uniform electron transport layer can be coated on a light emitting layer by using a fluorine containing solvent to result in no deterioration of efficiency even in the case of coating of a large area.

That is, the present invention has the following features. When there are coated at least an organic layer A and an organic layer B on a substrate in this order to form by laminating functional layers, the organic layer B is formed after the formation of the organic layer A. The organic layer B is formed by coating using as a fluorine containing solvent on the organic layer A. By this coating method, it is possible to laminate other functional layer than the light emitting layer on the light emitting layer which is made of a compound (material) having a low molecular weight with a wet process. In addition, a low molecular compound means a compound having a molecular weight of 2,000 or less, and more preferably it is a compound having a molecular weight of 1,000 or less.

Although the details of the reason why using a fluorine containing solvent will produce a favorable result are not fully known, the followings may be attributed to the reason. The material contained in a functional layer such as a light emitting layer has a high solubility in a non-polar solvent. Therefore, it can be formed a uniform and good light emitting layer by coating using a non-polar solvent such as toluene.

A fluorine containing solvent is a high polar solvent due to the electronegativity of fluorine. However, on the other hand, the fluorine atom portion is hard to make an interaction with other substance. As a result, a fluorine containing solvent makes a just suitable interaction with the material contained in the light emitting layer (the organic layer A) which serves as an underlaying layer. When other functional layer (the organic layer B) is coated using a fluorine containing solvent on the light emission layer, the underlaying layer cannot be easily invaded by the fluorine containing solvent, and the coating property (wettability) of the fluorine containing solvent is considered to be appropriate.

For this reason, it is supposed that a fluorine containing solvent does not dissolve the underlaying organic layer material, and it does not produce mixing or turbulence of a layer interface. As a result, uniform coating of an organic layer can be achieved.

Moreover, it is also guessed that that a decreased boiling point of a fluorine containing solvent compared with a non-fluorine containing solvent will affect the film forming nature.

As for the organic layer A, for example, a light emission layer used as an underlaying layer, is preferably coated using a non-polar solvent. Although the reason of this is not certain, it is supposed that the compound soluble in a non-polar solvent will be hardly invaded by the fluorine containing solvent having a high polarity.

Moreover, especially as mentioned above, when the material contained in an underlaying layer (the organic layer A), for example, in the light emitting layer, is a low molecular compound having a molecular weight of 2,000 or less, the effect of the present invention is outstanding.

Usually, in the case of low molecular material (compound), when an upper layer is laminated by the coating method, a layer interface tends to produce disturbance or nonuniformity by the coating liquid of the upper layer though mixing or penetration of a low molecular compound. According to the present invention, the layers containing a low molecular compound can be laminated with each other, without causing mutual penetration or mixing of the solute in each functional layer at an interface of the layers.

The reason why the effect is high when the underlaying layer contains a low molecular compound is presumed because a low molecular compound is more strongly affected by the solvent used in the upper layer coating than a polymer compound at the time of coating of the upper layer.

In the present invention, when an organic electronic element is an organic electroluminescence element, the above-mentioned organic layer A is preferably a light emitting layer. When other functional layer is laminated on a light emitting, it is preferable to from an upper layer by coating using a fluorine containing solvent since there will be no dissolution of the solute of the underlaying layer and neither mixing nor turbulence of a layer interface will be produced. In addition, when an organic electronic element is an organic photoelectric generating element, the above-mentioned organic layer A is preferably an electricity generating layer.

Moreover, since an electron transport layer is usually laminated on a light emitting layer and an electricity generating layer, the above-mentioned organic layer B is preferably an electron transport layer. That is, it is preferable to carry out laminate coating of the electron transport layer on the light emitting layer using a fluorine containing solvent.

Moreover, in the present invention, although a fluorine containing alcohol which will be mentioned later is preferable as the above-mentioned fluorine containing solvent, under the fundamental condition of without spoiling the characteristics of the above-mentioned fluorine containing solvent, the fluorine containing alcohol can be mixed with other polar solvent which does not contain fluorine. The ratio of the polar solvent mixed is 20% or less in a mass ratio. A polar solvent will be also mentioned later.

Further, the present invention preferably includes an organic electroluminescence element of a phosphorescence emission type exhibiting high luminous efficiency in which the above-mentioned functional layers are laminated as a light emitting layer. That is, in the present invention, it is preferable to provide a light emitting layer containing a phosphorescence emitting compound, and then an electron transport layer is laminated by coating using a fluorine containing solvent on the light emitting layer which contains a phosphorescence emitting compound.

In the present invention, before coating a functional layer using the above-mentioned fluorine containing solvent, it is preferable to form one or more organic layers which are cross-linked.

Although the cross-linked organic layer will be mentioned later, a light emitting layer may be, for example, a cross-linked light emitting layer which contains a host compound or a dopant compound which has a reactive group.

Moreover, preferable embodiment has a functional layer such as a positive hole transport layer which is located as an adjacent underlaying layer of the light emitting layer contains a compound having a reactive group, and specifically preferable embodiment has a cross-linked organic layer.

In the manufacturing process, for example, in the step of laminating a layer by a wet process, since it is preferable that an underlaying layer does not dissolve in the upper coating solution, the upper layer coating can be enabled by forming cross-linkage to result in resinifying the underlaying layer and reducing the solubility in the solvent of the upper coating solution. Therefore, a light emitting layer can be uniformly formed as a film on a cross-linked positive hole transport layer by using a wet process. And further, an electron transport layer (or a hole inhibiting layer) can be formed by coating using a fluorine-containing solvent. Any functional layers can be formed and laminated by a wet process, and it is desirable.

In order to resinify an organic layer by achieving cross-linking, it can be used, for example, an organic compound which has a reactive group (a reactive organic compound). After coating a reactive organic compound, the reactive organic compound is allowed to react by giving energy such as UV lights and heat, and the coated layer can be cross-linked.

By using the cross-linked organic layer, deterioration of the element can be prevented by controlling Tg (glass transition point) of composition layers (functional layers). Moreover, it is possible to change the emission wavelength of an organic EL element or to control deterioration of a specified wavelength by adjusting the reaction which yields cutting or formation of the conjugated system of a molecule using an active radical species in an organic EL element.

The reactive group which can be used in the present invention and the organic material which has a reactive group will be described later.

Here, the fluorine containing solvents will be described.

In the present invention, the fluorine containing solvents are not specifically limited. The compounds containing a fluorine atom in the molecular structure are suitably used.

For example, a fluorine containing hydrocarbon, a fluorine containing alcohol, a fluorine containing aromatic compound, a fluorine containing ether, a fluorine containing ketone, a fluorine containing ester, a fluorine containing amide, and a fluorine containing carboxylic acid are cited.

In the present invention, from the viewpoints of obtaining an element which can be driven with a small voltage to give high emission efficiency, it is preferable to use a fluorine containing alcohol.

As one of the preferable fluorine containing alcohol, there can be cited the compounds represented by the following Formula (1), Formula (2) and Formula (3).

  Formula (1)

In Formula (1), A represents $CF_3$ or $CHF_2(CF_2)_n$. n is an integer of 1 to 5, n is preferably an integer of 1 to 3, n is more preferably an integer of 1. Examples of a fluorine containing alcohol are as follows.

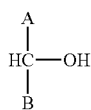  Formula (2)

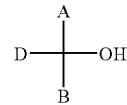  Formula (3)

In Formulas (2) and (3), A, B and C each represent $CH_{3-x}F_x$ or $CH_{3-x}F_x(CH_{2-y}F_y)_n$, x is an integer of 1 to 3, y is an integer of 1 or 2, and n is an integer of 0 or 1.

As examples of these fluorine containing alcohols, the following compounds are cited, for example.
2,2,3,3-tetrafluoropropanol,
2,2,3,3,3-pentafluoropropanol,
2-trifluoromethyl-2-propanol,
2,2,3,3,4,4-hexafluorobutanol,
2,2,3,3,4,4,5,5-octafluoropentanol,
1,1,1,3,3,3-hexafluoro-2-propanol,
2,2,2-trifluoro-1-ethanol,
2,3-difluorobenzylalcohol,
2,2,2-trifluoroethanol,
1,3-difluoro-2-propanol,
1,1,1-trifluoro-2-propanol,
3,3,3-trifluoro-1-propanol,
2,2,3,3,4,4,4-heptafluoro-1-butanol,
2,2,3,3,4,4,5,5-octafluoro-1-pentanol,
3,3,4,4,5,5,5-heptafluoro-2-pentanol,
2,2,3,3,4,4,5,5,6,6,7,7,8,8,8-pentadecafluoro-1-octanol,
3,3,4,4,5,5,6,6,7,7,8,8-tridecafluoro-1-octanol,
1H,1H,9H-perfluoro-1-nonanol,
1H,1H,2H,3H,3H-perfluorononane-1,2-diol,
1H,1H,2H,2H-perfluoro-1-decanol, and
1H, 1H,2H,3H,3H-perfluoroundecane-1,2-diol.

Among them, fluorine containing propanol derivatives are preferable, and more preferable are 2,2,3,3-tetrafluoro-2-propanol, 1,1,1,3,3,3-hexafluoro-2-propanol, and 2,2,3,3,3-pentafluoropropanol.

It is preferable that these fluorine containing solvents are distilled for using.

The polar solvent and non-polar solvent in the present invention will be described.

<Polar Solvent and Non-Polar Solvent>

In the present invention, a polar solvent refers to a solvent chosen from a carboxylic acid, an alcohol, a nitrile, an amine and a ketone. These solvents can be used by mixing with a fluorine containing solvent of the present invention.

Preferable solvents which are mixed with a fluorine containing solvent are selected from: an alcohol (for example, methanol, alcohol, isopropanol, 1-propanol and butanol); a nitrile (for example, acetonitrile and propionitrile); and a ketone (for example, acetone, methyl ethyl ketone, diisopropyl ketone and cyclohexanone).

Especially, acetonitrile is preferable among them. When the polar solvent is mixed, the content of the polar solvent with respect to the weight of a fluorine-containing solvent is 20 weight % or less, and more preferably it is 10 weight % or less.

In the present invention, a non-polar solvent refers to a solvent chosen from the following solvents: a chain hydrocarbon compound (for example, pentane, hexane and heptane); a cyclic hydrocarbon compound (for example, cyclopentane, cyclohexane and cycloheptane); an aromatic hydrocarbon compound (for example, benzene, toluene, xylene, chlorobenzene and dichlorobenzene); and an ether (for example, diethyl ether, diisopropyl ether, tetrahydrofuran and dioxane). As a solvent especially used for the coating of a light emitting layer, an aromatic compound is preferable, and especially preferable are toluene and chlorobenzene.

<Metal Layer or Metal Compound Layer after Coating with a Fluorine Containing Solvent>

After coating with a fluorine containing solvent, there is no restriction in particular for the layer laminated on it. It is preferable to laminate the layer containing metal or a metal compound from the viewpoint of improving efficiency.

These layers containing the metal or metal compound are used for an electron injection layer or an electrode (a cathode) which is further laminated on an electron transport layer. The electron transport layer has been formed on a substrate by coating with a fluorine containing solvent after the formation of for example, an anode, a positive hole injection layer, a positive hole transport layer and a light emitting layer. By laminating this layer, it is formed an organic EL element having a composition of sandwiching a variety of laminated functional layers between the electrodes. These layers containing the metal or metal compound are formed as a film by vacuum evaporation or the spattering using each material, with or without employing a mask. Moreover, these layers may be formed by coating a solution of a metal compound dissolved in a solvent, or by coating a dispersion of nano particles of metal or metal compound in a solvent.

Although there is no restriction in particular as a metal and a metal compound, as an electrode layer, metallic compounds (which will be described later), such as strontium and an aluminium, can be cited. Moreover, as an electron injection layer (a cathode buffer layer), an alkali metal compound represented by lithium fluoride, an alkaline earth metal compound represented by magnesium fluoride, an oxide represented by aluminium oxide are cited.

Specifically preferable compounds are an alkali metal compound, lithium fluoride, sodium fluoride, potassium fluoride and cesium fluoride.

<Structure of Organic EL Element>

An organic EL element of the present invention is composed of a substrate (supporting substrate), electrodes, organic layers which exhibit a variety of functions. Preferred embodiments of the organic EL element of the present invention will be described below, however, the present invention is not limited to these.

(1) Anode/positive hole transport layer/electron inhibition layer/light emitting layer/positive hole inhibition layer/electron transport layer/cathode (2) Anode/positive hole transport layer/electron inhibition layer/light emitting layer/positive hole inhibition layer/electron transport layer/cathode buffer layer/cathode (3) Anode/anode buffer layer/positive hole transport layer/electron inhibition layer/light emitting layer/positive hole inhibition layer/electron transport layer/cathode (4) Anode/anode buffer layer/positive hole transport layer/electron inhibition layer/light emitting layer/positive hole inhibition layer/electron transport layer/cathode buffer layer/cathode <Light Emitting Layer Unit>

"The light emitting layer" of the present invention may be a single layer or may be "a light emitting layer unit" composed of a plurality of light emitting layers. "The light emitting layer unit" refers to the laminated organic layers including from the light emitting layer located at the nearest position of the anode to the light emitting layer located at the nearest position of the cathode.

Representative examples which compose a light emitting layer unit is shown below, however, the light emitting layer unit is not limited to these.

(1) Light emitting layer A/light emitting layer B (2) Light emitting layer A/inter layer/light emitting layer B (3) Light emitting layer A/positive hole inhibition layer/light emitting layer B (4) Light emitting layer A/electronic inhibition layer/light emitting layer B (5) Light emitting layer A/light emitting layer B/light emitting layer C (6) Light emitting layer A/inter layer/light emitting layer B/inter layer/light emitting layer C (7) Light emitting layer A/inter layer/light emitting layer B/hole inhibition layer/light emitting layer C (8) Light emitting layer A/electronic inhibition layer/light emitting layer B/inter layer/light emitting layer C In order to make the luminescent color of the organic EL element of the present invention for illumination, it is preferable that the light emitting layers contain the light emitting dopants exhibiting 2 or more colors. Furthermore, it is more preferable that the light emitting layers contain the light emitting dopants exhibiting 3 or more colors from the viewpoints of color rendition and a color reproduction region. Furthermore, it is more preferable that the 3 or more light emitting dopants are chosen from the compound exhibiting the luminescence peaks of 440-480 nm, 500-540 nm, and 600-640 nm.

The light emitting layers can also be composed of two or more light emitting layers containing two or more sorts of luminescent dopants in which luminescence maximum wavelengths differ. The light emitting layer unit may be provided with an interlayer between the light emitting layers and may be composed of two or more light emitting layers. Moreover, it is possible to include two or more sorts of luminescent dopants each exhibiting a different luminescence maximum wavelength in a single light emitting layer. By this composition, it is possible to emit lights having a different luminescence maximum wavelength from a single light emitting layer.

When the light emitting layers are composed of two or more layers, the light emitting layer nearest to a hole inhibition layer or an electron transport layer is formed as a film by coating (wet process) with a non-polar solvent, such as toluene. Further, on this film, a hole inhibition layer or an electron transport layer is formed similarly by coating using a fluorine-containing solvent.

Moreover, as for a host compound which will be described later, it is preferable that the same host compound is used in all of the light emitting layers from the viewpoint of achieving a good driving lifetime.

<Light Emitting Layer>

The light emitting layer of the present invention is a layer, which emits light via recombination of electrons and positive holes injected from an electrode or a layer such as an electron transport layer or a positive hole transport layer. The light emitting portion may be present either within the light emitting layer or at the interface between the light emitting layer and an adjacent layer thereof.

<Host Compound>

A host compound contained in the light emitting layer of the present invention is defines a compound having the following properties. A host compound is a compound which transfers the energy of exciton produced by recombination of carriers on the host compound to a light emitting dopant (a guest compound) and emits light from the dopant. In addition, another type of host compound is a compound which makes the light emitting dopant to trap the carriers on the host compound so as to produce an exciton on the light emitting dopant, and as a result, to emit light from the dopant.

In the present invention, a host compound is preferably has a weight ratio of at least 20% of the total compounds contained in the light emitting layer.

It may be used a conventionally known host compound singly or it may be used in combination with plural host compounds. As a light emitting dopant which will be described later, it is preferable to use a phosphorescence emitting compound. It is possible to mix a different emission lights by making use of a plurality of phosphorescent dopants. Any required emission color can be obtained thereby.

Further, an emission host used in the present invention may be either a conventionally known low molecular weight compound or a polymer compound having a repeating unit, in addition to a low molecular weight compound provided with a polymerizing group such as a vinyl group and an epoxy group (an evaporation polymerizing emission host). Among them, a low molecular weight compound having a molecular weight of 1,000 of less is preferable since it will give a high efficiency.

Structures of the light emitting host employed in the present invention are not particularly limited. The conventionally known host compounds in organic EL elements can be used. Representative compounds include those having a basic skeleton such as carbazole derivatives, triarylamine derivatives, aromatic compound derivatives, nitrogen-containing heterocyclic compounds, thiophene derivatives, furan derivatives, oligoarylene compounds, carboline derivatives, or diazacarbazole derivatives (here, "a diazacarbazole derivative" indicates a ring structure in which at least one of the carbon atoms constituting the carboline ring is replaced with a nitrogen atom).

A host compound which may be used in the present invention is preferably a compound having a positive hole transporting ability and an electron transporting ability, as well as preventing elongation of an emission wavelength and having a high Tg (a glass transition temperature).

As specific examples of a host compound, the compounds described in the following documents are preferable. For example, JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

A carbazole derivative which is preferably used as a host compound in the present invention is represented by the following Formula (a).

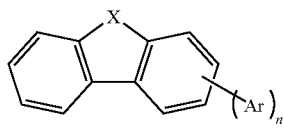

Formula (a)

In the Formula (a), X represents NR', O, S, CR'R", or SiR'R". R' and R" each represent a hydrogen atom or a substituent. Ar represents an aromatic ring. n represents an integer of 0 to 8.

Examples of a group represented by R' and R in X of Formula (1) include: an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group); a cycloalkyl group (for example, a cyclopentyl group, and a cyclohexyl group); an alkenyl group (for example, a vinyl group and an allyl group); an alkynyl group (for example, an ethynyl group and a propargyl group); an aromatic hydrocarbon ring group (also called an aromatic carbon ring or an aryl group, for example, a phenyl group, a p-chlorophenyl group, a mesityl group, a tolyl group, a xylyl group, a naphthyl group, an anthryl group, an azulenyl group, an acenaphthenyl group, a fluorenyl group, a phenantolyl group, an indenyl group, a pyrenyl group, and a biphenyryl group); an aromatic heterocyclic group (for example, a pyridyl group, a pyrimidinyl group, a furyl group, a pyrrolyl group, an imidazolyl group, a benzoimidazolyl group, a pyrazolyl group, a pyradinyl group, a triazolyl group (for example, 1,2,4-triazole-1-yl group and 1,2,3-triazole-1-yl group), an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothenyl group, an indolyl group, a carbazolyl group, a carbolynyl group, a diazacarbazolyl group (which is a group in which one of the carbon atoms constituting the carboline ring of the above carbolynyl group is replaced with a nitrogen atom), a quinoxalinyl group, a pyridazinyl group, a triazinyl group, a quinazolinyl group, a phthalazinyl group); a heterocyclic group (for example, a pyrrolidyl group, an imidazolidyl group, a morpholyl group, and an oxazolidyl group); an alkoxyl group (for example, a methoxy group, an ethoxy group, a propyloxy group, a pentyloxy group, an hexyloxy group, an octyloxy group, and a dodecyloxy group); a cycloalkoxy group (for example, a cyclopentyloxy group and a cyclohexyloxy group); an aryloxy group (for example, a phenoxy group and a naphthyloxy group); an alkylthio group (for example, a methylthio group, an ethylthio group, a propylthio group, a pentylthio group, a hexylthio group, an octylthio group, and a dodecylthio group); a cycloalkylthio group (for example, a cyclopentylthio group and a cyclohexylthio group; an arylthio group (for example, a phenylthio group and a naphthylthio group); an alkoxycarbonyl group (for example, a methyloxycarbonyl group, an ethyloxycarbonyl group, a butyloxycarbonyl group, an octyloxycarbonyl group, and a dodecyloxycarbonyl group); an aryloxycarbonyl group (for example, a phenyloxycarbonyl group and a naphthyloxycarbonyl group); a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group a dodecylaminosulfonyl group, a phenylaminosulfonyl group, a naphthylaminosulfonyl group, and a 2-pyridylaminosulfonyl group); an acyl group (for example, an acetyl group, an ethylcarbonyl group, a propylcarbonyl group, a pentylcarbonyl group a cyclohexylcarbonyl group, an octylcarbonyl group a 2-ethylhexylcarbonyl group, a dodecylcarbonyl group, a phenylcarbonyl group, a naphthylcarbonyl group, and a pyridylcarbonyl group); an acyloxy group (for example, an acetyloxy group, an ethylcarbonyloxy group, a butylcarbonyloxy group, an octylcarbonyloxy group, a dodecylcarbonyloxy group, and a phenylcarbonyloxy group); an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group); a ureido group (for example, a methylureido group, an ethylureido group, a pentylureido group, a cyclohexylureido group, an octylureido group, a dodecylureido group, a phenylureido group, a naphthylureido group, and a 2-oyridylaminoureido group); a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsulfinyl group); an alkylsulfonyl group (for example, a methylsulfonyl group, an ethylsulfonyl group, a butylsulfinyl group, a cyclohexylsulfonyl group, a 2-ethylhexylsulfonyl group, and a dodecylsulfonyl group, an arylsulfonyl group or a heteroarylsulfonyl group (for example, a phenylsulfonyl group, a naphthylsulfonyl group, and a 2-pyridylsulfonyl group); an amino group (for example, an amino group, an ethylamino group, a dimethylamino group, a butylamino group, a cyclopentylamino group, a dodecylamino group, an anilino group, a naphthylamino group, and a 2-pyridylamino group); a cyano group; a nitro group; a hydroxyl group; a mercapto group; a silyl group (for example, a trimethylsilyl group, a triisopropylsilyl group, a triphenylsilyl group, and a phenyldiethylsilyl group) and a phosphono group.

Moreover, these substituents may be further substituted by the above-mentioned substituent. Further, a plurality of these substituents may combine with each other to form a ring.

In the Formula (a), X is preferably NR' or O, and R' is Specifically preferable to be an aromatic hydrocarbon ring or an aromatic heterocycle.

In the Formula (a), examples of an aromatic ring represented by Ar are an aromatic hydrocarbon ring and an aromatic heterocycle. In addition, an aromatic ring may be a single sing or may be a condensed ring and these rings may be unsubstituted or substituted with a substituent which will be described later.

In Formula (a), examples of an aromatic hydrocarbon represented by Ar include: a benzene ring, a biphenyl ring a naphthalene ring, an azulene ring, an anthracene ring, a phenanthrene ring, a pyrene ring, a chrysene ring, a naphthacene ring, a triphenylene ring, o-terphenyl ring, m-terphenyl ring, p-terphenyl ring, an acenaphthene ring, a coronene ring, a fluorene ring, a fluoanthrene ring, a naphthacene ring, a pentacene ring, a perylene ring, a pentaphene ring, a picene ring, a pyrene ring, a pyranthrene ring and an anthraanthrene ring. These rings may further have a substituent.

In Formula (a), examples of an aromatic heterocycle represented by Ar include: a furan ring, a dibenzofuran ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, an indazole ring, a benzimidazole ring, a benzothiazole ring, a benzooxazole ring, a quinoxaline ring, a quinazoline ring, a cinnoline ring, a quinoline ring, an isoquinoline ring, a phthalazine ring naphthylidine ring, a carbazole ring, a carboline ring, a diazacarbazole ring (indicating a group in which one of the carbon atoms constituting the carboline ring of the above carbolinyl group is replaced with a nitrogen atom). These rings may further have a substituent.

Among these rings, preferably used as an aromatic ring represented by Ar in Formula (a) are: a carbazole ring, a carboline ring, a dibenzofuran ring, and benzene ring. Especially preferable rings are: a carbazole ring, a carboline ring, and benzene ring.

Among these, a benzene ring having a substituent is more preferable, and in particular, a benzene ring having a carbazolyl group is most desirable.

Moreover, in Formula (a), preferable examples of an aromatic ring represented by Ar are condensed rings with three or more rings, and specific examples of a condensed aromatic hydrocarbon ring having three or more rings are:

a naphthacene ring, an anthracene ring, a tetracene ring, a pentacene ring, a hexacene ring a phenanthrene ring, a pyrene ring, a benzopyrene ring a benzoazulene ring, a chrysene ring, a benzochrysene ring, an acenaphthene ring, an acenaphthylene ring, a triphenylene ring, a coronene ring, a benzocoronene ring, a hexabenzocorone ring, a fluorene ring, a benzofluorene ring, a fluoranthene ring, a perylene ring, a naphthoperylene ring, a pentabenzoperylene ring, a benzoperylene ring, a pentaphene ring, a picene ring, a pyranthrene ring, a coronene ring, a naphthocoronene ring, an ovalene ring, an anthraanthrene ring. In addition, these rings may further have a substituent.

Moreover, examples of a condensed aromatic heterocycle having three or more rings are: an acridine ring, a benzoquinoline ring, a carbazole ring, a carboline ring, a phenazine ring, a phenanthridine ring, a phenanthroline ring, a carboline ring, a cycladine ring, a quindoline ring, a thebenidine ring, a quinindoline ring, a triphenodithiazine ring, a triphenodioxazine ring, a phenanthrazine ring, an anthrazine ring, a perimizine ring, a diazacarbazole ring (indicating a ring structure in which one of the carbon atoms constituting the carboline ring is replaced with a nitrogen atom), a phenanthroline ring, a dibenzofuran ring, a dibenzothiophene ring, a naphthofuran ring, a naphthothiophene ring a benzodifuran ring, a benzodithiophene ring, a naphthodifuran ring, a naphthodithiophene ring, an anthrafuran ring, an anthradifuran ring, an anthrathiophene ring, an anthradithiophene ring, a thianthrene ring, a phenoxathiine ring, and a thiophanthrene ring (naphthothiophene ring). These rings may further have a substituent.

Here, in Formula (a), the substituents which may be possessed by an aromatic ring represented by Ar are synonymous with the substituents represented by R' and R".

Moreover, in Formula (a), although n represents an integer of 0 to 8, n is preferably an integer of 0 to 2. Especially, when X is O or S, it is preferable that n is 1 or 2.

In Formula (a), the substituents which may be possessed by an aromatic ring represented by Ar are synonymous with the substituents represented by R' and R".

In the following, preferable examples of a host compound represented by Formula (a), a carbazole derivative, a carboline derivative and a diazacarbazole derivative both of which are as preferable as a carbazole derivative are shown. However, the present invention is not limited to these.

1
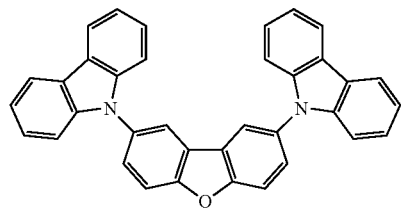
2
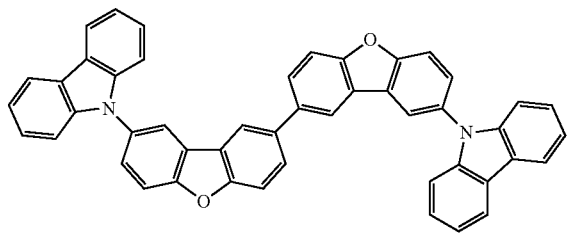
3
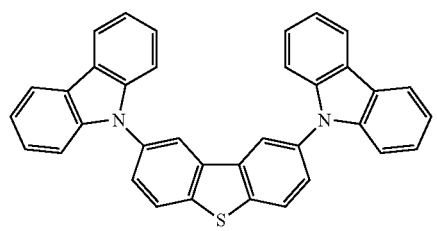
4
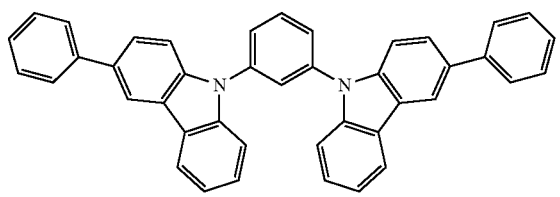
5
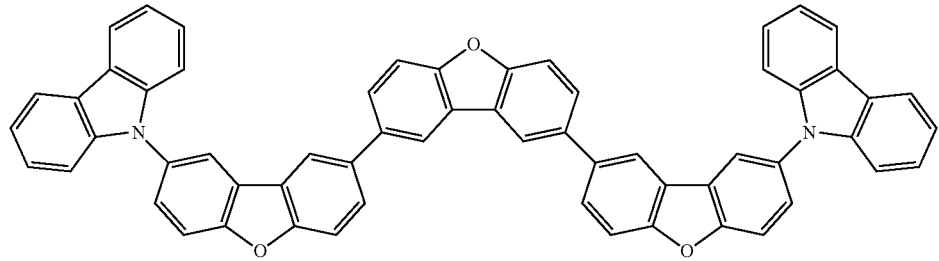
6
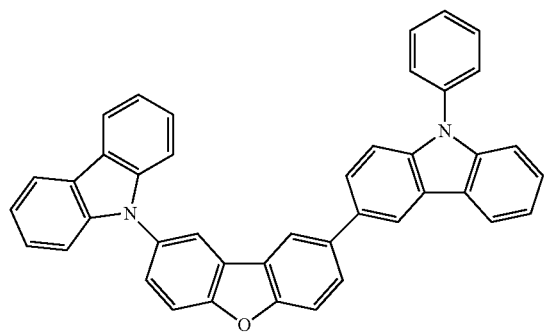
7
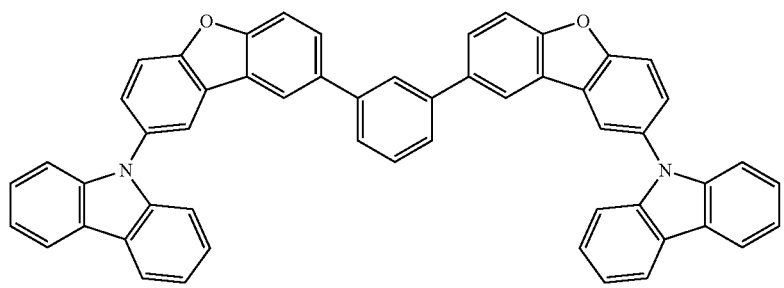
8
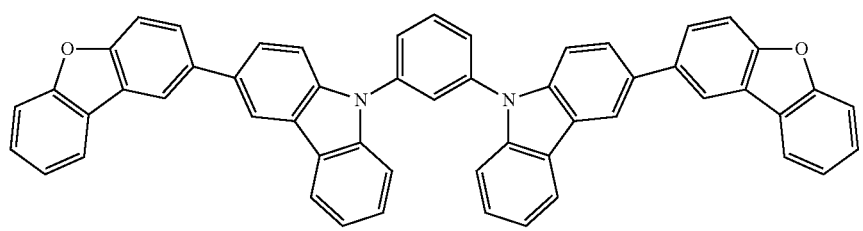

-continued
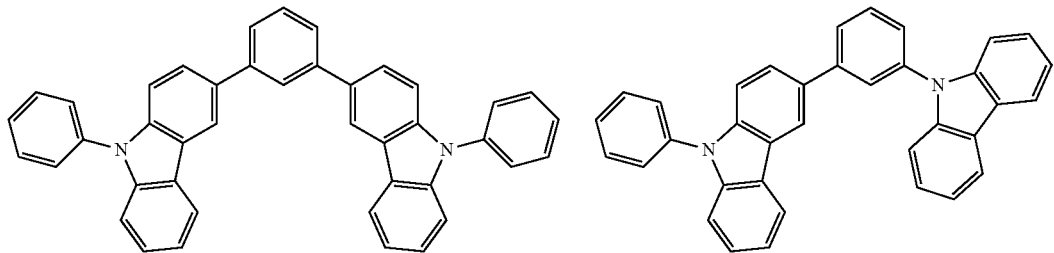
9
10
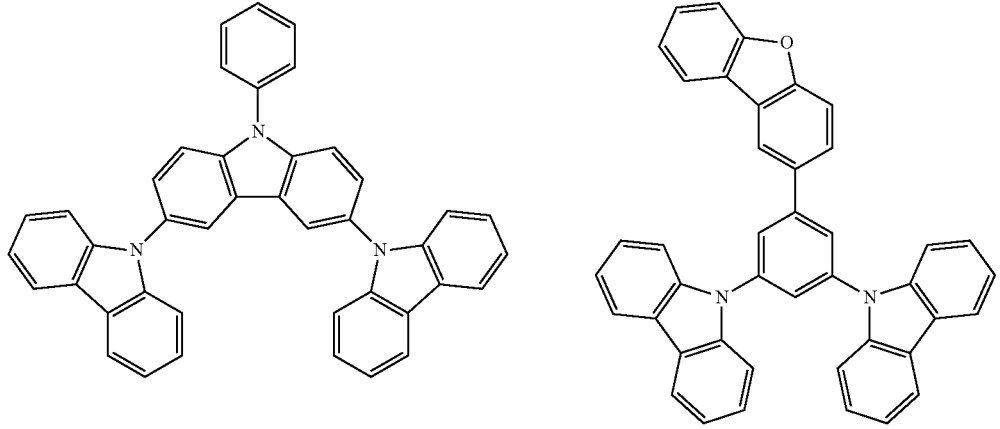
11
12
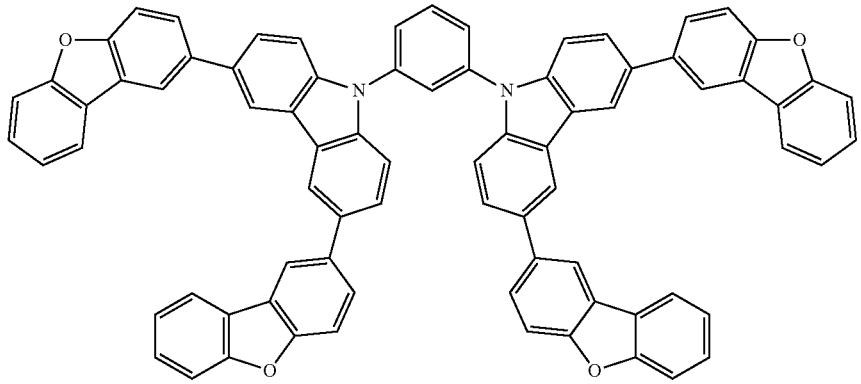
13
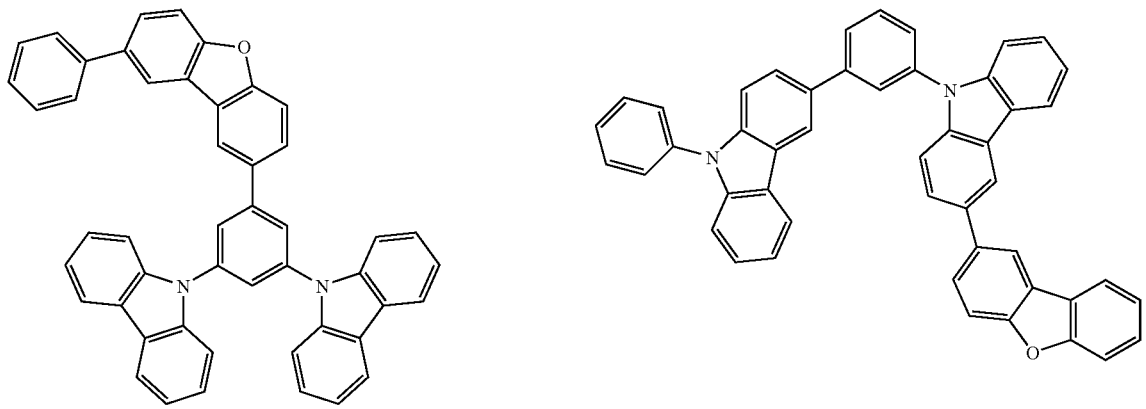
14
15

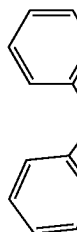
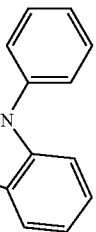
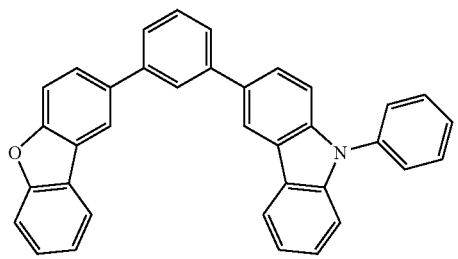
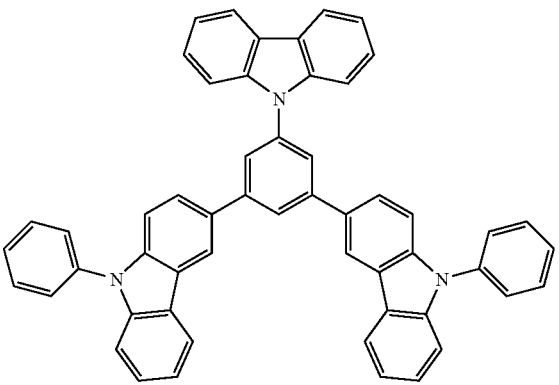
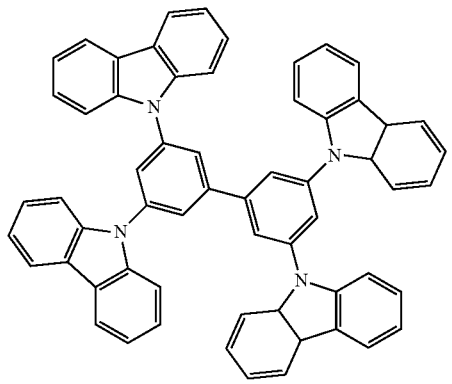
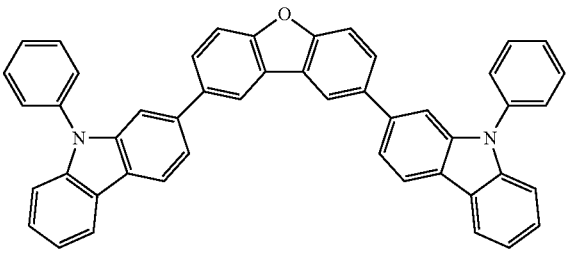
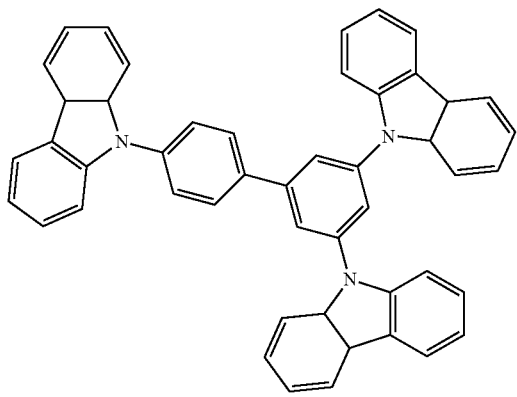
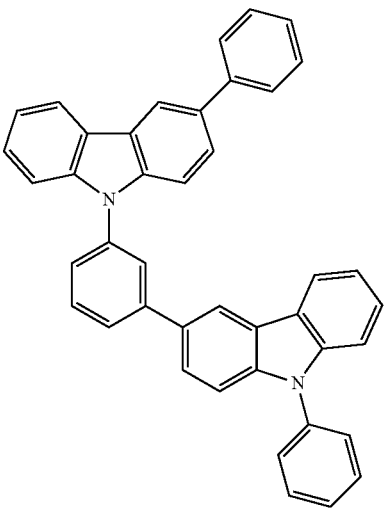

-continued
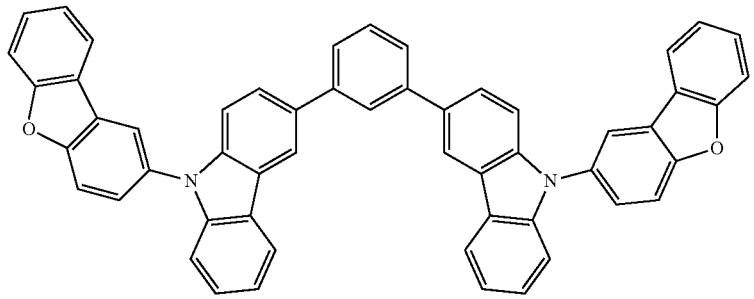
23
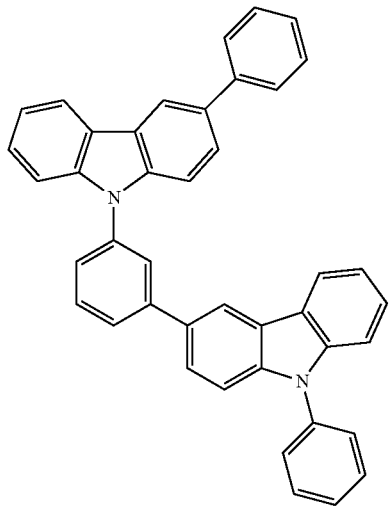
24
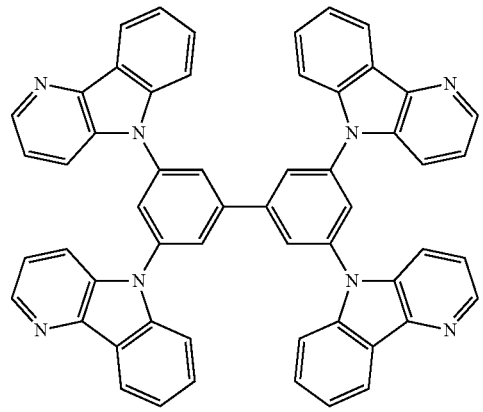
25
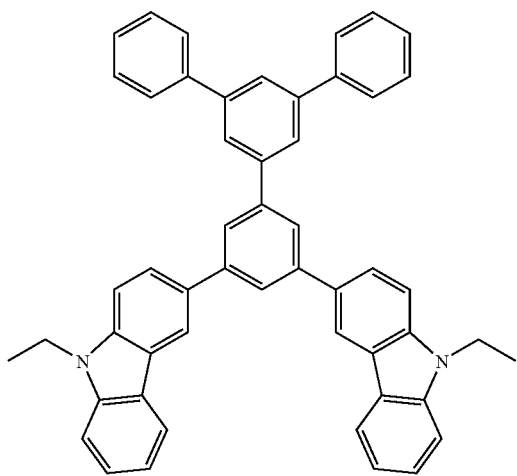
26
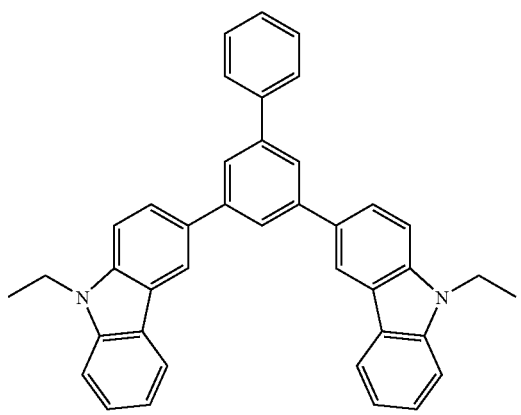
27

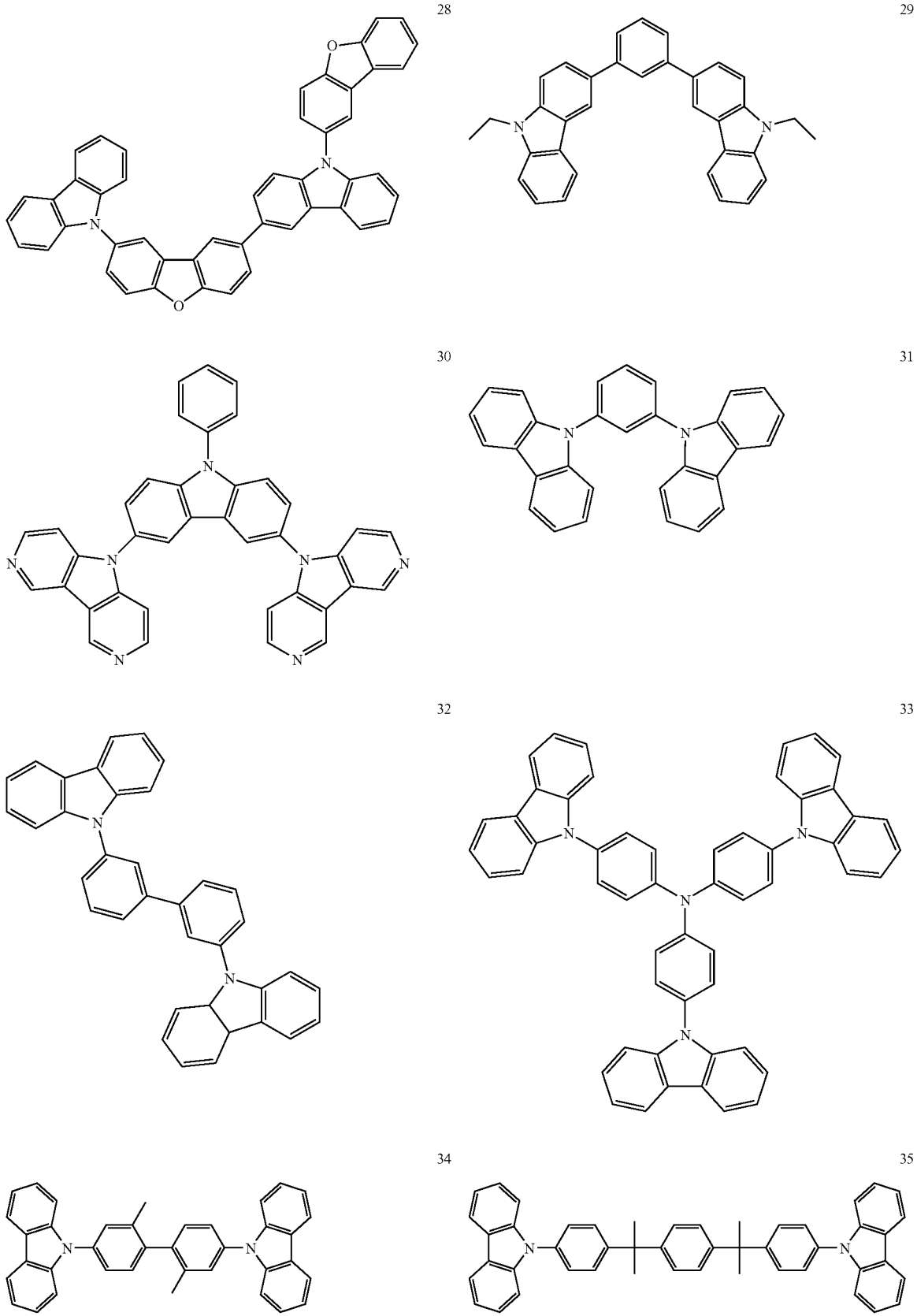

-continued
36
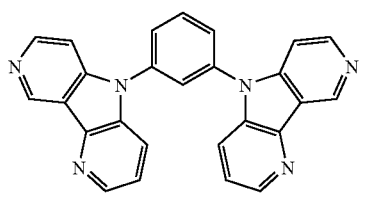
37
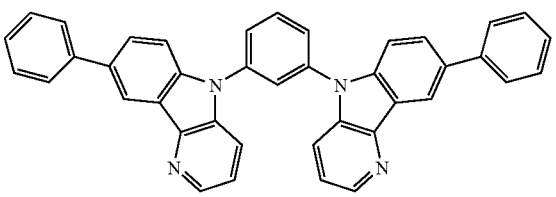
38
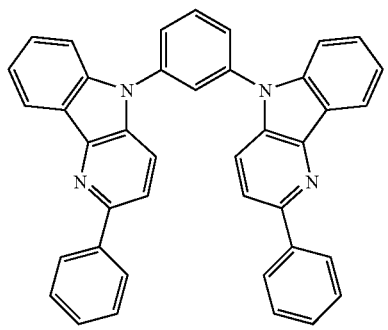
39
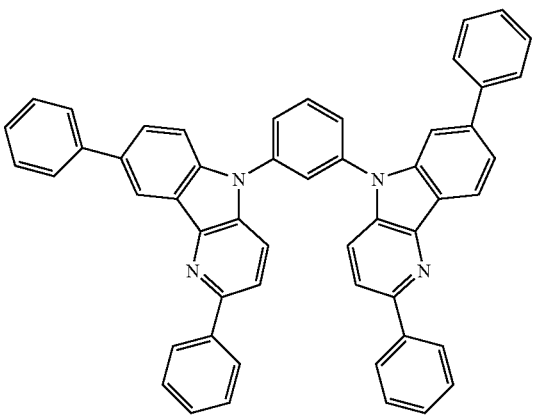
40
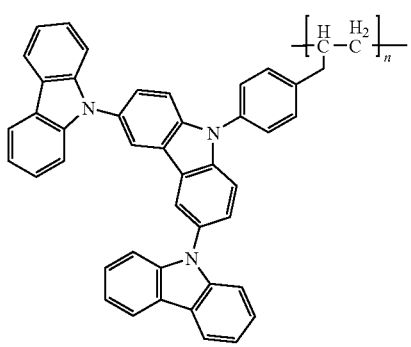
41
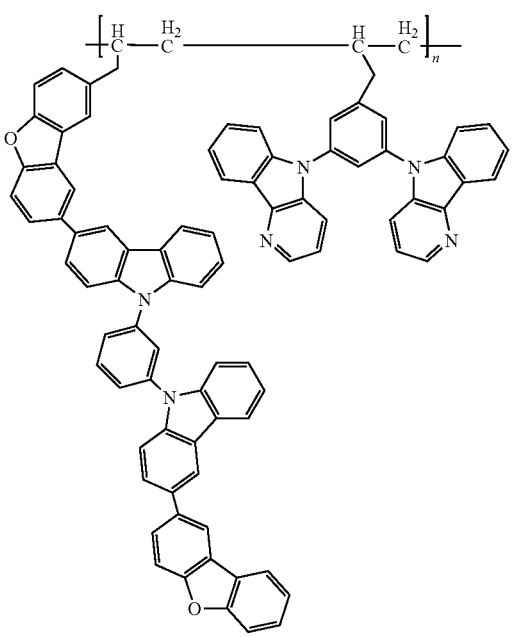
42
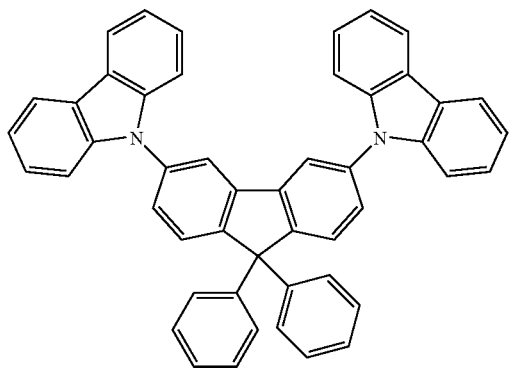
43
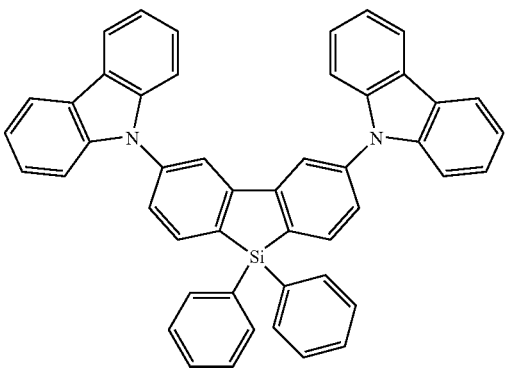

(Light Emitting Dopant)

As light emitting dopants, there are known phosphorescent dopants (also referred to as phosphorescent emitting dopants, or phosphorescence emitting compounds) and fluorescent dopants. In the present invention, phosphorescent dopants are employed in order to obtain an organic EL element exhibiting high light emitting efficiency.

((Phosphorescent Dopant (Also Referred to as Phosphorescence Emitting Dopant))

The phosphorescent dopant of the present invention is a compound, wherein emission from an excited triplet state thereof is observed, specifically, it is a compound emitting phosphorescence at room temperature (25° C.) and exhibiting a phosphorescence quantum yield of at least 0.01 at 25° C. The phosphorescence quantum yield is preferably at least 0.1.

The phosphorescence quantum yield can be determined via a method described in page 398 of Bunko II of Dai 4 Han Jikken Kagaku Koza 7 (Spectroscopy II of 4th Edition Lecture of Experimental Chemistry 7) (1992, published by Maruzen Co., Ltd.). The phosphorescence quantum yield in a solution can be determined using appropriate solvents. However, it is only necessary for the phosphorescent dopant of the present invention to exhibit the above phosphorescence quantum yield using any of the appropriate solvents. Two kinds of principles regarding emission of a phosphorescent dopant are cited. One is an energy transfer-type, wherein carriers recombine on a host compound on which the carriers are transferred to produce an excited state of the host compound, and then via transfer of this energy to a phosphorescent dopant, emission from the phosphorescence-emitting dopant is realized. The other is a carrier trap-type, wherein a phosphorescence-emitting dopant serves as a carrier trap and then carriers recombine on the phosphorescent dopant to generate emission from the phosphorescent dopant. In each case, the excited state energy of the phosphorescent dopant is required to be lower than that of the host compound.

The phosphorescence emitting compounds can be suitably selected and used from the known compounds employed in the light emitting layer of an organic EL element. The phosphorescence emitting compounds according to the present invention are complex based compounds which incorporate preferably metals in Groups 8-10 of the element periodic table, more preferably iridium compounds, osmium compounds, platinum compounds (platinum complex based compounds), and rare earth metal complexes, and of these, most preferred are iridium compounds.

Example compounds which are used for a phosphorescence emitting compound are shown below, however, the present invention is not limited to them. These compounds can be synthesized by the methods disclosed in, for example, Inorg. Chem. Vol. 40, 1704-1711.

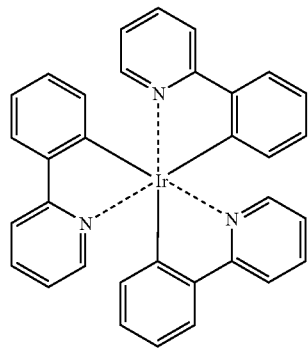

Ir-1

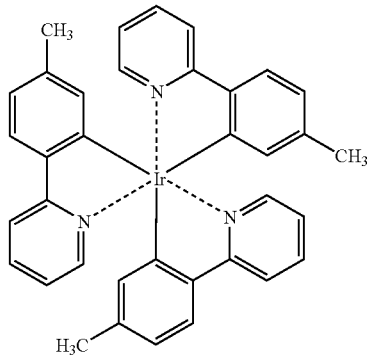

Ir-2

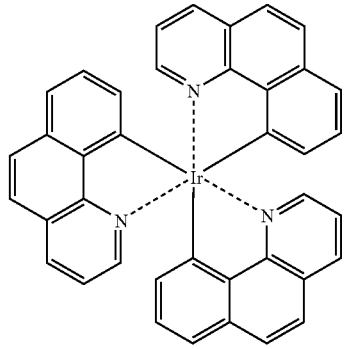

Ir-3

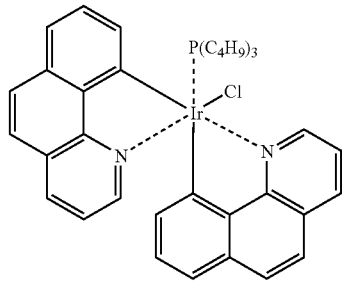

Ir-4

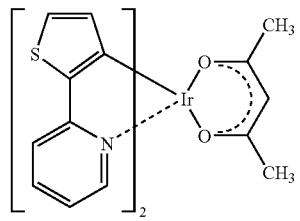

Ir-5

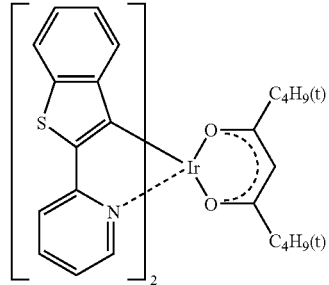

Ir-6

Ir-7
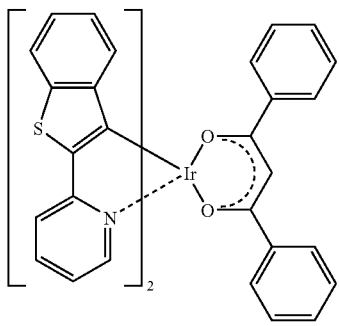
Ir-8
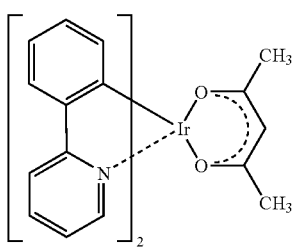
Ir-9
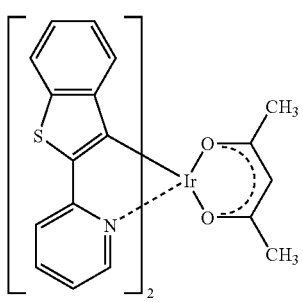
Ir-10
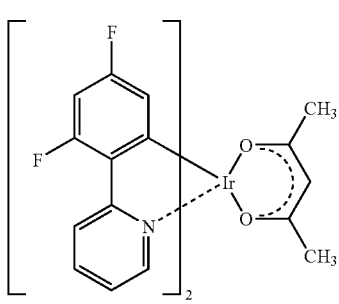
Ir-11
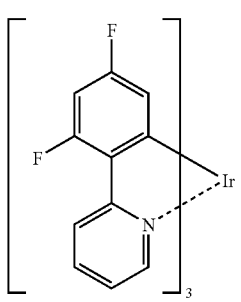
Ir-12
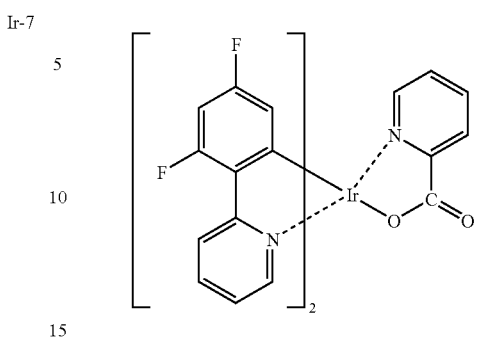
Ir-13
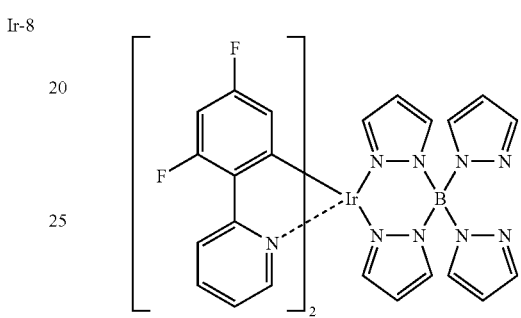
Ir-14
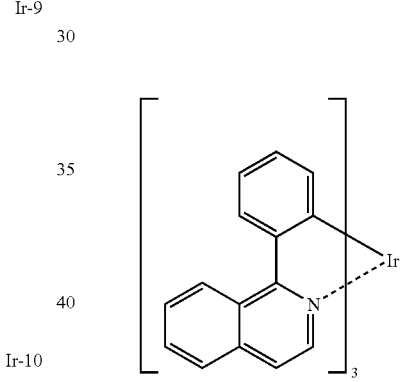
Pt-1
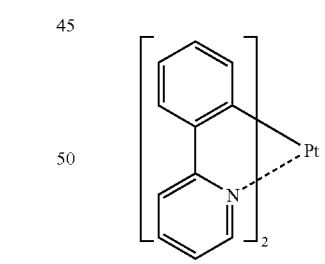
Pt-2
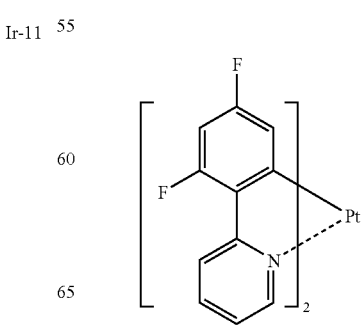

Pt-3
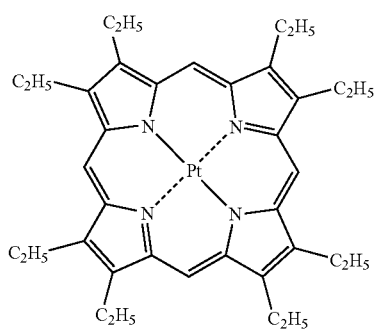
A-1
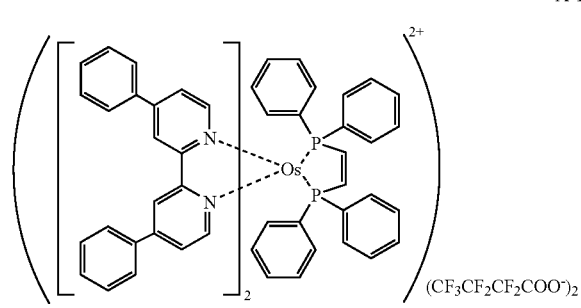
D-1
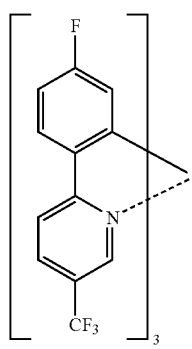
D-2
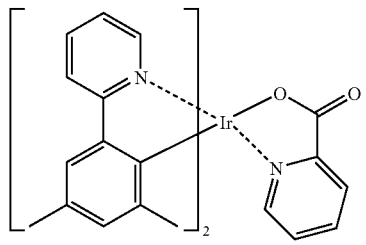
D-3
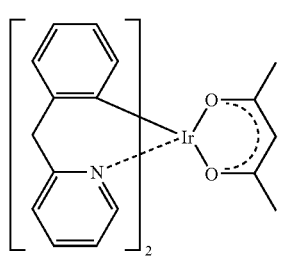
D-4
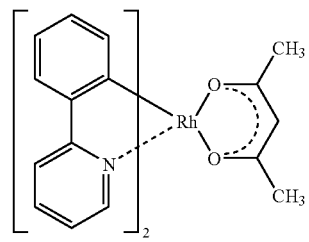
D-5
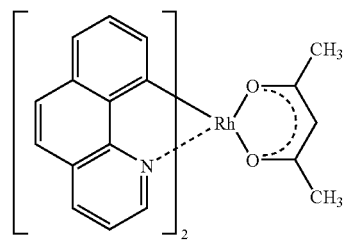
D-6
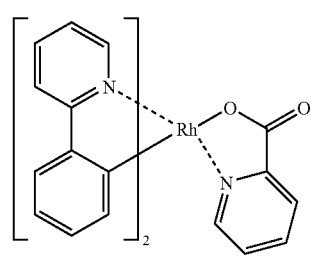
Pd-1
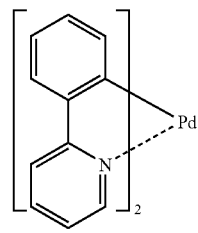
Pd-2
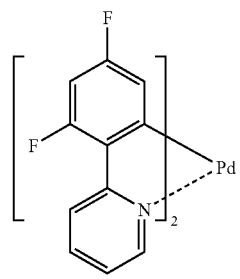
Pd-3
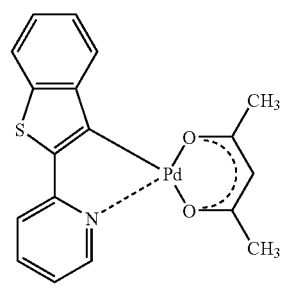

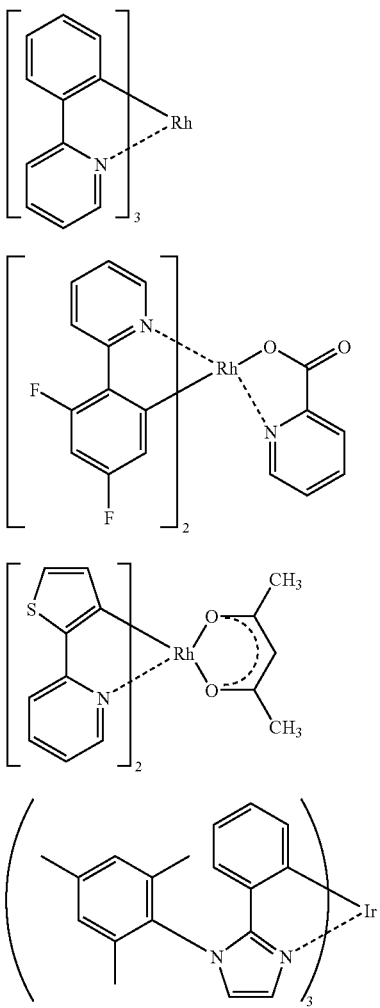

The light emitting layer containing these host compounds and light emitting dopants is preferably formed with a wet process such as coating a solution of a non-polar solvent like toluene as described above. In the present invention, a functional layer is formed in the same manner as forming the light emitting layer with a wet process using a fluorinated solvent on the light emitting layer.

<Non-Light Emitting Interlayer>

In the present invention, when a plurality of light emitting layers are provided, a non-light emitting interlayer may be provided between the light emitting layers as a carrier controlling layer.

The thickness of the non-light emitting interlayer is preferably in the range of 1-15 nm, but is more preferably in the range of 3-10 nm to retard the mutual interaction, such as an energy transfer, between the adjacent light emitting layers and to result in no high load to electric current and voltage characteristics of organic EL elements.

In the present invention, it may be possible to coat an organic layer B, as an interlayer or an another light emitting layer, on an organic layer A which is a light emitting layer. The organic layer A and the organic layer each can be coated using a non-polar solvent such as a fluorine containing solvent.

However, it is preferable to apply coating with a wet process when a functional layer such as electron transport layer is provided on the light emitting layer. Therefore, the present invention is preferably employed when an electron transport layer is provided on the uppermost layer of a plurality of light emitting layers.

Materials employed in the above non-light emitting interlayer may be the same as the host compounds of the light emitting layer or differ. However, it is preferable that they are the same as the host materials contained in at least one of two adjacent light emitting layers.

In a non-light emitting interlayer, there may be used the compounds usable as a host compound, or the compounds usable in a positive hole transport layer or in an electron transport layer.

<Positive Hole Transport Layer>

A positive hole transport layer contains a material having a function of transporting a positive hole, and in a broad meaning, a positive hole injection layer and an electron inhibition layer are also included in a positive hole transport layer. A single layer of or plural layers of a positive hole transport layer may be provided.

A positive hole transport material is those having any one of a property to inject or transport a positive hole or a barrier property to an electron, and may be either an organic substance or an inorganic substance. For example, listed are a triazole derivative, an oxadiazole derivative, an imidazole derivative, a polyarylalkane derivative, a pyrazolone derivative, a phenylenediamine derivative, an arylamine derivative, an amino substituted chalcone derivative, an oxazole derivatives, a styrylanthracene derivative, a fluorenone derivative, a hydrazone derivative, a stilbene derivative, a silazane derivative, an aniline type copolymer, or conductive polymer oligomer and specifically preferably such as thiophene oligomer.

As a positive hole transport material, those described above can be utilized, however, it is preferable to utilized a porphyrin compound, an aromatic tertiary amine compound and a styrylamine compound, and specifically preferably an aromatic tertiary amine compound. Typical examples of an aromatic tertiary amine compound and a styrylamine compound include: N,N,N',N'-tetraphenyl-4,4'-diaminophenyl; N,N'-diphenyl-N,N'-bis(3-methylphenyl)-(1,1'-biphenyl)-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl 4,4'-diaminobiphenyl; 1,1-bis(4-di-p-tolylaminophenyl)-4-phenylcyclohexane; bis(4-dimethylamino-2-methyl)phenylmethane; bis(4-di-p-tolylaminophenyl) phenylmethane; N,N'-diphenyl-N,N'-di(4-methoxyphenyl)-4,4'-diaminobiphenyl; N,N,N',N'-tetraphenyl-4,4'-diaminophenylether, 4,4'-bis(diphenylamino)quadriphenyl; N,N, N-tri(p-tolyl)amine; 4-(di-p-tolylamino)-4'-[4-(di-p-triamino)styryl]stilbene; 4-N,N-diphenylamino-(2-diphenylvinyl)benzene; 3-methoxy-4'-N,N-diphenylaminostilbene; and N-phenylcarbazole, in addition to those having two condensed aromatic rings in a molecule described in U.S. Pat. No. 5,061,569, such as 4,4'-bis[N-(1-naphthyl)-N-phenylamino]biphenyl (NDP), and 4,4',4"-tris[N-(3-methylphenyl)-N-phenylamino]triphenylamine (MDTDATA), in which three of triphenylamine units are bonded in a star burst form, described in JP-A No. 4-308688. Polymer materials, in which these materials are introduced in a polymer chain or constitute the main chain of a polymer, can be also utilized.

Further, an inorganic compound such as a p type-Si and a p type-SiC can be utilized as a positive hole injection material and a positive hole transport material. Further, it is possible to employ so-called p type positive hole transport materials, as described in Japanese Patent Publication Open to Public Inspection (referred to as JP-A) No. 11-251067, and J. Huang et al. reference (Applied Physics Letters 80 (2002), p. 139).

Further, it is possible to employ a positive hole transport layer of a higher p property which is doped with impurities. As its example, listed are those described in each of JP-A Nos. 4-297076, 2000-196140, 2001-102175, as well as in J. Appl. Phys., 95, 5773 (2004).

In the present invention, it is preferable to employ a positive hole transport layer of such a high p property, since it is possible to produce an element of lower electric power consumption.

This positive hole transport layer can be prepared by forming a thin layer made of the above-described positive hole transport material according to a method well known in the art such as a vacuum evaporation method, a spin coating method, a cast method, an inkjet method and a LB method. The layer thickness of a positive hole transport layer is not specifically limited, however, it is generally 5 nm-5 μm, and preferably 5 nm-200 nm. This positive transport layer may have a single layer structure comprised of one or not less than two types of the above described materials.

<Electron Transport Layer>

An electron transport layer is composed of a material having a function to transfer an electron, and an electron injection layer and a positive hole inhibition layer are included in an electron transport layer in a broad meaning. A single layer or plural layers of an electron transport layer may be provided. Conventionally, a single or a plurality of electron transport layers are provided at a nearer position to a cathode than a light emitting layer. Electron transport materials (also including a positive hole inhibition material and an electron injection material) employed in the electron transport layer are only required to have a function of transporting electrons ejected from the cathode to the light emitting layer. As such materials, any of the conventional compounds may be selected and employed. Examples of the conventional compounds which can be used in an electron transport layer include: a nitro-substituted fluorene derivative, a diphenylquinone derivative, a thiopyradineoxide derivative, carbodiimide, a fluorenylidenemethane derivative, anthraquinonedimethane, an anthrone derivative, and an oxadiazole derivative.

Further, a thiadiazole derivative in which an oxygen atom in the oxadiazole ring of the above-described oxadiazole derivative is substituted by a sulfur atom, and a quinoxaline derivative having a quinoxaline ring which is known as an electron attracting group can be utilized as an electron transport material. Polymer materials, in which these materials are introduced in a polymer chain or these materials form the main chain of a polymer, can be also utilized.

Further, a metal complex of a 8-quinolinol derivative such as tris(8-quinolinol)aluminum ($Alq_3$), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq); and metal complexes in which a central metal of the aforesaid metal complexes is substituted by In, Mg, Cu, Ca, Sn, Ga or Pb, can be also utilized as an electron transport material. Further, metal-free or metal phthalocyanine, or those the terminal of which is substituted by an alkyl group and a sulfonic acid group, can be preferably utilized as an electron transport material. In addition, a distyrylpyrazine Derivative which was exemplified as a material used for a light emitting layer can be used as an electron transport material. Moreover, similarly to the case of a positive hole injection layer and to the case of a positive hole transfer layer, an inorganic semiconductor such as an n-type-Si and an n-type-SiC can be also utilized as an electron transport material.

The electron transport layer may be a single layer structure containing of one or more types of the above described materials. Further, it is possible to employ an electron transport layer doped with impurities, which exhibits a high n property. Examples thereof include those described in JP-A Nos. 4-297076, 10-270172, 2000-196140, 2001-102175, as well as J. Appl. Phys., 95, 5773 (2004).

In the present invention, it is preferable to use an electron transport layer having a high n property because it enables to prepare an organic EL element consuming low electric power. Specifically preferable organic compounds used in an electron transport layer having a high n property are: a phenanthroline derivative and a carboline derivative. A carboline derivative is more specifically preferable. As a compound to be doped is an alkali metal salt, an alkali metal fluoride is more preferable, and cesium fluoride is most preferable. The electron transport layer can be preferably prepared by forming a thin layer made of the above-described electron transport material with a vacuum evaporation method, a spin coating method, a cast method, a printing method including an ink-jet method, or a wet process on a light emitting layer, for example. A wet preparation method is also called as a wet process including a LB method (Langmuir Blodgett method). In the present invention, it is preferable to laminate an electron transport layer on a light emitting layer using a wet process. The layer thickness of the electron transport layer of the present invention is not specifically limited; however, it is generally about 5 nm-5 μm, and preferably it is 5-200 nm.

<Injection Layer: Electron Injection Layer and Positive Hole Injection Layer>

An injection layer is a layer which is arranged between an electrode and an organic layer to decrease an operating voltage and to improve an emission luminance, which is detailed in volume 2, chapter 2 (pp. 123-166) of "Organic EL Elements and Industrialization Front thereof (Nov. 30, 1998, published by N. T. S Corp.)", and includes a positive hole injection layer (an anode buffer layer) and an electron injection layer (a cathode buffer layer).

An injection layer is appropriately provided when required. It may be arranged between an anode and a light emitting layer or a positive hole transfer layer, or between a cathode and a light emitting layer or an electron transport layer, as described above.

An anode buffer layer (a positive hole injection layer) is also detailed in such as JP-A 9-45479, 9-260062 and 8-288069, and specific examples include such as a phthalocyanine buffer layer comprising such as copper phthalocyanine, an oxide buffer layer comprising such as vanadium oxide or nickel oxide, an amorphous carbon buffer layer, and a polymer buffer layer employing conductive polymer such as polyaniline (or called as emeraldine) or polythiophene.

A cathode buffer layer (an electron injection layer) is also detailed in such as JP-A 6-325871, 9-17574 and 10-74586, and specific examples include a metal buffer layer comprising such as strontium and aluminum, an alkali metal compound buffer layer comprising such as lithium fluoride, an alkali earth metal compound buffer layer comprising such as magnesium fluoride, and an oxide buffer layer comprising such as aluminum oxide or titanium oxide.

The above-described buffer layer (injection layer) is preferably a very thin layer, and the layer thickness is preferably in a range of 0.1-5 nm although it depends on a raw material.

<Inhibition Layer: Positive Hole Inhibition Layer and Electron Inhibition Layer>

A positive hole inhibition layer, in a broad meaning, is provided with a function of electron transport layer, being comprised of a material having a function of transporting an electron but a very small ability of transporting a positive hole, and can improve the recombination probability of an electron and a positive hole by inhibiting a positive hole while transporting an electron. Further, a constitution of an electron transport layer described above can be appropriately utilized as a positive hole inhibition layer according to the present invention. The positive hole inhibition layer of the organic EL element of the present invention is preferably arranged adjacent to the light emitting layer.

An inhibition layer is appropriately provided in addition to the basic constitution layers composed of organic thin layers as described above. Examples are described in such as JP-A Nos. 11-204258 and 11-204359 and p. 273 of "Organic EL Elements and Industrialization Front Thereof (Nov. 30 (1998), published by N. T. S Corp.)" is applicable to a positive hole inhibition (hole block) layer according to the present invention.

In the present invention, at least 50% by weight of the compounds incorporated in the positive hole inhibition layer preferably exhibits the ionization potential which is greater by at least 0.2 eV than that of the host compounds of the aforesaid shortest wavelength light emitting layer. It is preferable that the positive hole inhibition layer of the present invention contains the aforesaid electron donor since it will increase the electron density and it will result in lowering of a driving voltage.

The ionization potential is defined as energy which is necessary to release electrons in the HOMO (being the highest occupied molecular orbital) to the vacuum level, and may be determined via, for example, the method described below.

(1) By employing Gaussian98 (Gaussian98, Revision A. 11. 4, M. J. Frisch, et al. Gaussian 98 (Gaussian98, Revision A. 11. 4, M. J. Frisch, et al, Gaussian, Inc., Pittsburgh Pa., 2002), which is a molecular orbital calculation software, produced by Gaussian Co. in the United State of America, and by employing B3LYP/6-31G* as a key word, the value (in terms of corresponding eV unit) was computed, and it is possible to obtain the ionization potential by rouging off the second decimal point. The background, in which the resulting calculated values are effective, is that the calculated values obtained by the above method exhibit high relationship with the experimental values.

(2) It is possible to determine the ionization potential via a method in which ionization potential is directly determined employing a photoelectron spectrometry. For example, by employing a low energy electron spectrophotometer "Model AC-1", produced by Riken Keiki Co., or appropriately employ a method known as an ultraviolet light electron spectrometry.

On the other hand, the electron inhibition layer, as described herein, has a function of the positive hole transport layer in a broad sense, and is composed of materials having markedly small capability of electron transport, while having capability of transporting positive holes and enables to enhance the recombination probability of electrons and positive holes by inhibiting electrons, while transporting electrons. It is preferable that the electron inhibition layer of the present invention contains the aforesaid positive hole transport material. In addition, when the electron inhibition layer contains further the aforesaid electron acceptor, an effect of lowering of a driving voltage can be obtained.

The thickness of the positive hole inhibition layer and the electron transport layer according to the present invention is preferably 3-100 nm, and it is more preferably 5-30 nm.

<Reactive Organic Compound>

In the present invention, an organic compound having a reactive group (a reactive organic compound) may be used in each of the above-described functional layers. There is no restriction in particular as a layer in which a reactive organic compound is used, and it can be uses in each layer.

A network polymer of an organic molecule can be formed by allowing to react a reactive organic compound on a substrate. That is, the cross-linked layer can be prepared. In the present invention, before coating using a fluorine containing solvent, it is preferable to prepare the organic layer which is cross-linked.

By formation of a network polymer, the deterioration of an organic EL element can be prevented by tuning a Tg (glass transition point) a composition layer.

Moreover, it is possible to change the emission wavelength of an organic EL element or to control deterioration of a specified wavelength by adjusting the reaction which yields cutting or formation of the conjugated system of a molecule using an active radical species in an organic EL element.

In the case of the manufacturing process of laminating by a wet process, it is preferable that an underlaying layer does not dissolve in the upper coating solution, and it is possible to coat the upper layer by making the underlaying layer to resinify and to reduce solubility in the solvent. For example, when laminating on one electrode with a positive hole transport layer, a light emitting layer, and an electron transportation layer in that order, it is possible to prevent the dissolution or penetration of the underlaying layer by converting the light emitting layer into a cross-linked organic layer before applying an electron transport layer using a fluorine containing solvent. Furthermore, for example, by resinifying a positive hole transporting layer to become an organic layer which is cross-linked in this way, it is possible to prevent the dissolution or penetration of the underlaying layer by converting the positive hole transport layer into a cross-linked organic layer when applying a light emitting layer as an upper layer on the positive hole transporting layer. Therefore, in this method, after forming a positive hole transport layer by coating and then cross-linked, a light emitting layer can be formed by coating using a non-polar solvent. Or an electron transport layer can be coated by using a fluorine containing solvent. Since these layers can be formed with a coating method (wet process), it is convenient in respect of production.

Examples of a reactive group which can be used in the present invention are shown below.

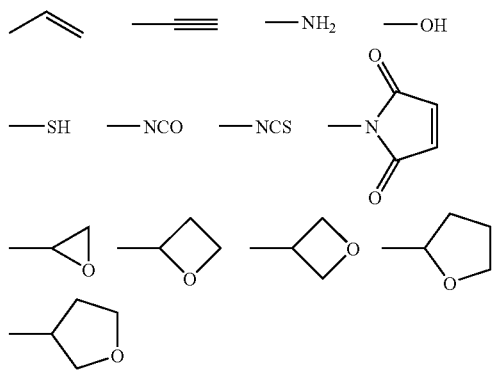

In addition, examples of a reactive organic compounds are shown. Compounds 1-1 to 1-10 are a host compound, Compounds 2-1 to 2-17 are a phosphorescent emitting compound, Compounds 3-1 to 3-17 are a positive hole transport compound, and Compounds 4-1 to 4-1- are a electron transport compound. Each of them has a reactive group in the molecule.

1-1
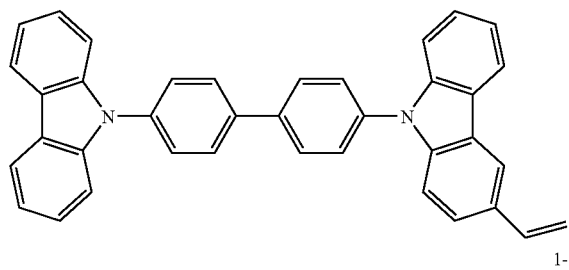
1-2
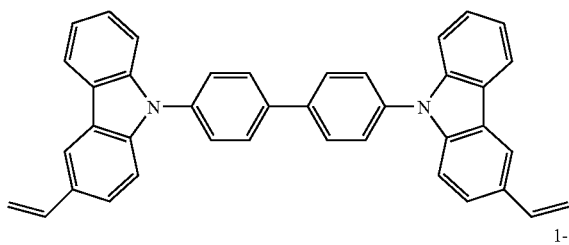
1-3
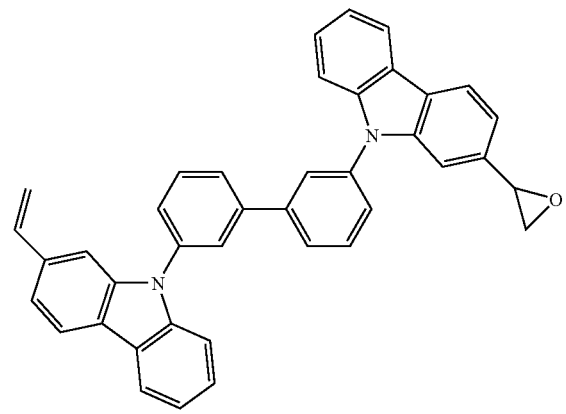
1-4
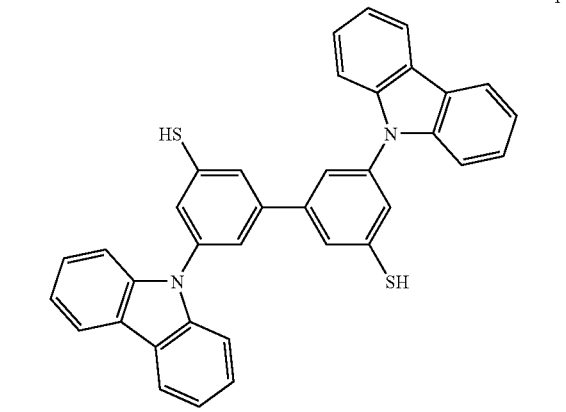
1-5
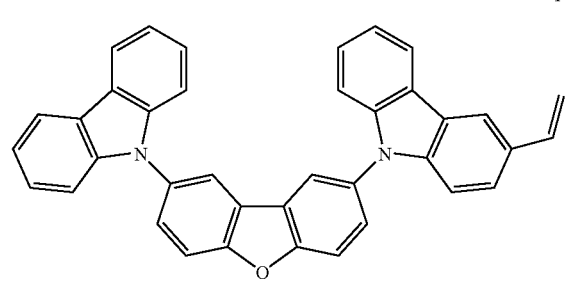
1-6
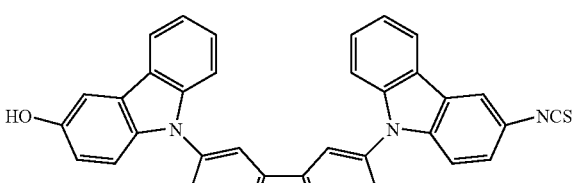
1-7
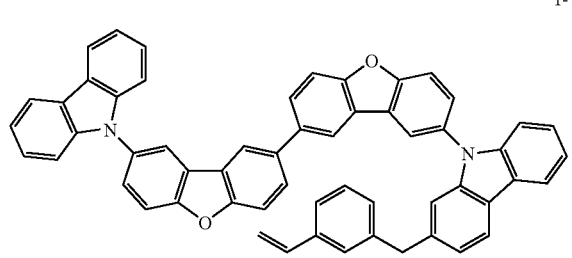
1-8
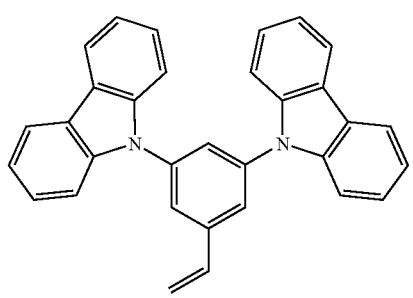
1-9
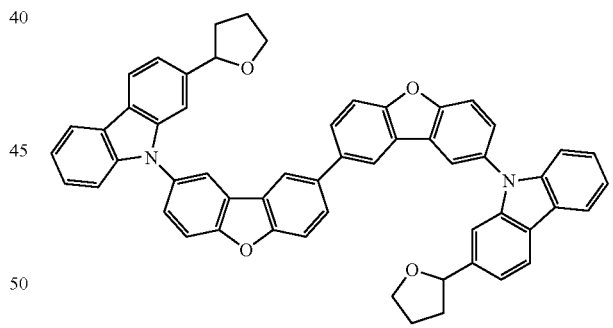
1-10
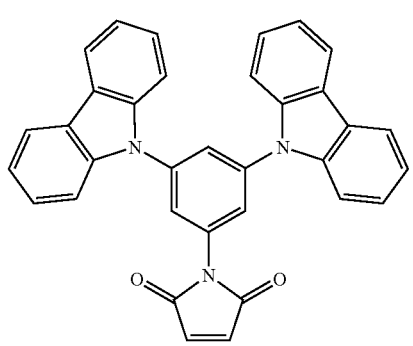

2-1 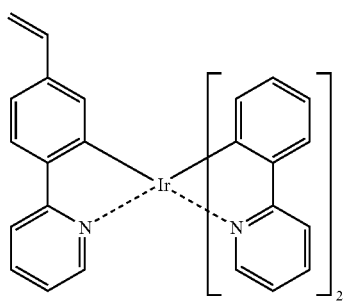
2-2 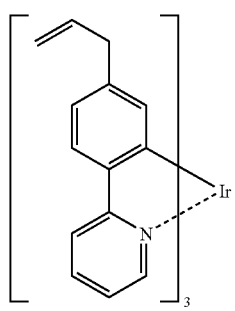
2-3 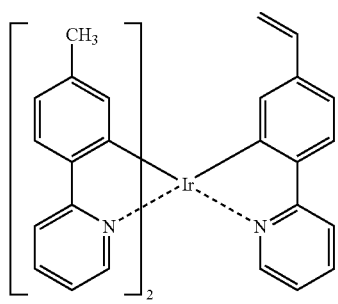
2-4 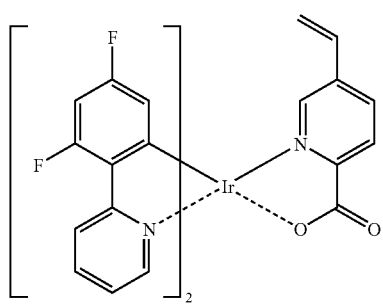
2-5 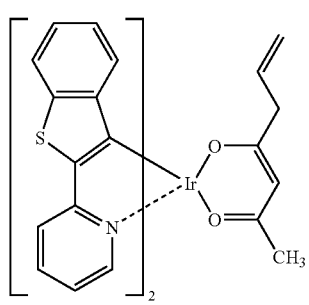
2-6 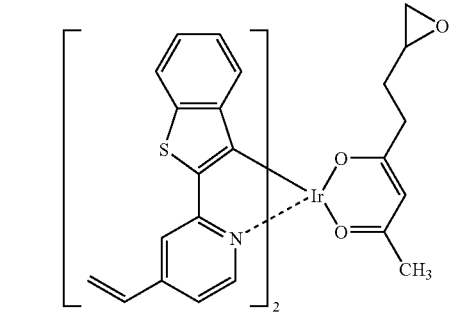
2-7 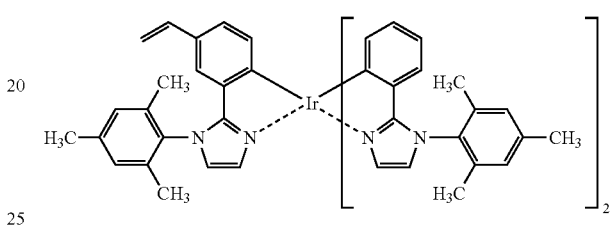
2-8 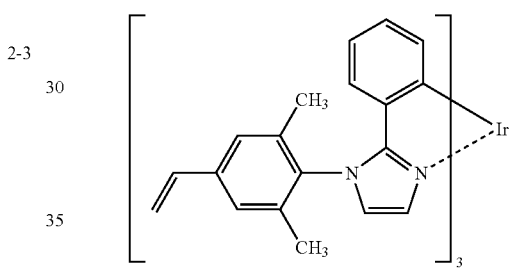
2-9 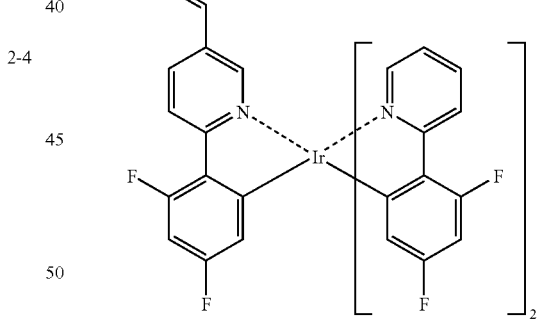
2-10 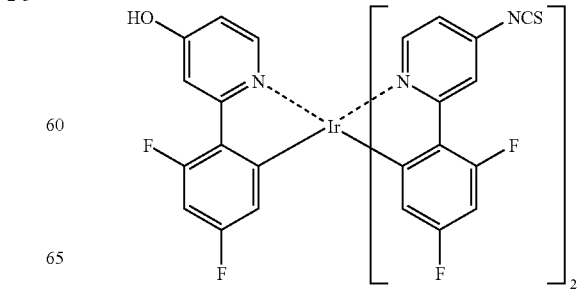

2-11
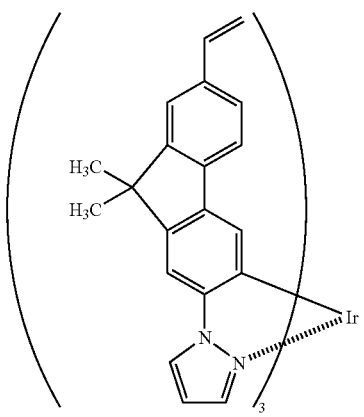
2-12
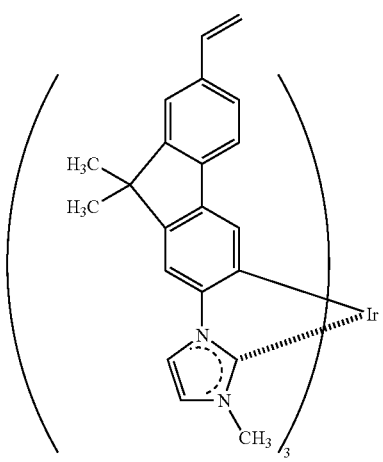
2-13
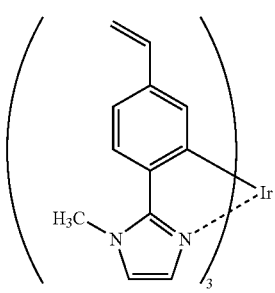
2-14
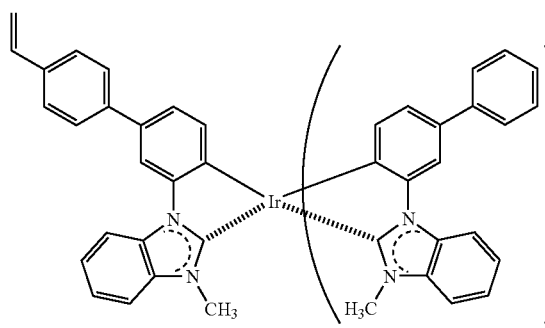
2-15
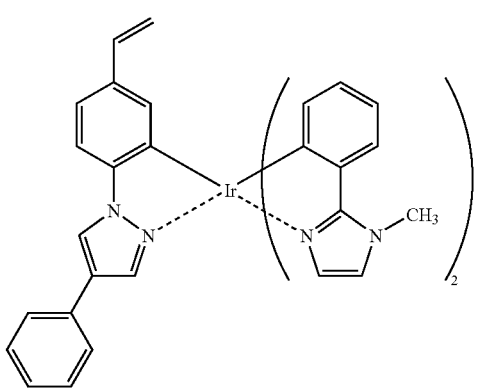
2-16
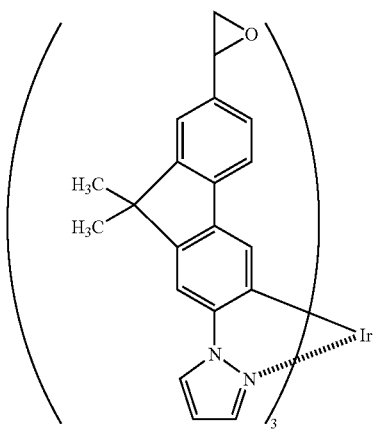
2-17
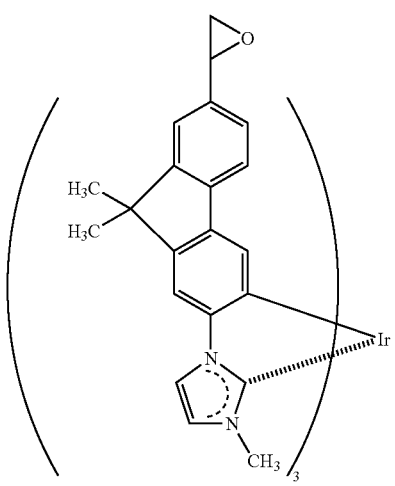
3-1
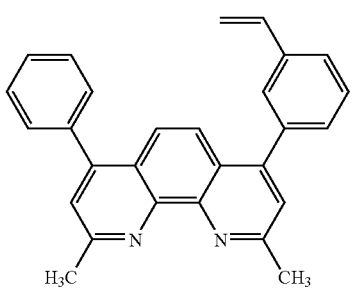

-continued
3-2
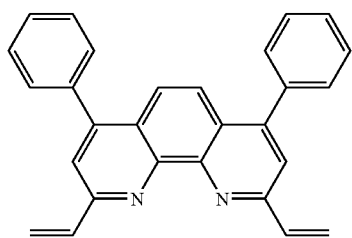
3-3
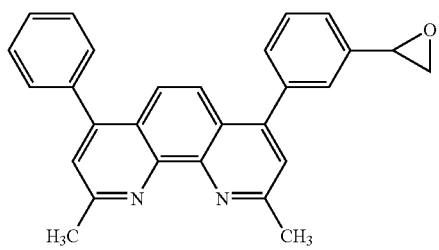
3-4
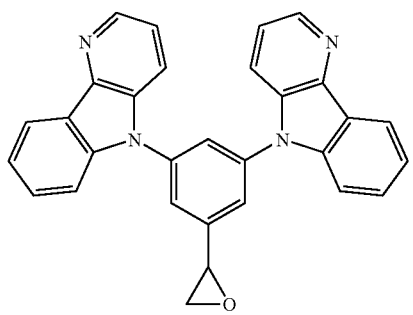
3-5
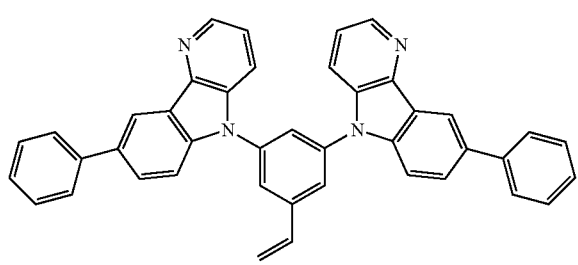
3-6
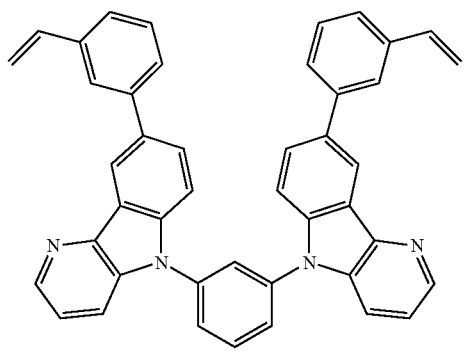
-continued
3-7
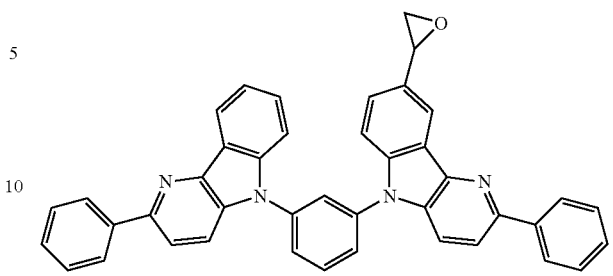
3-8
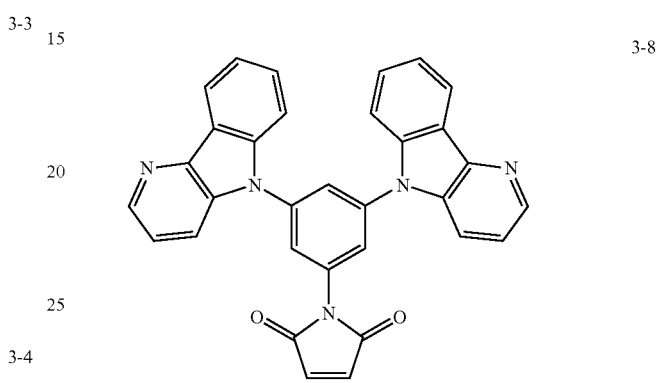
3-9
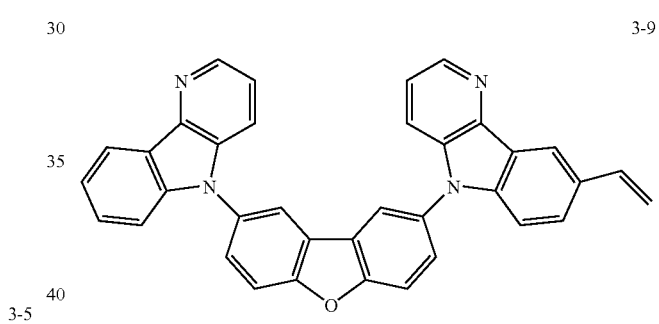
3-10
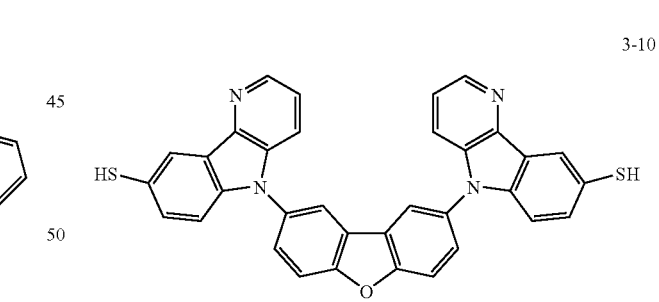
4-1
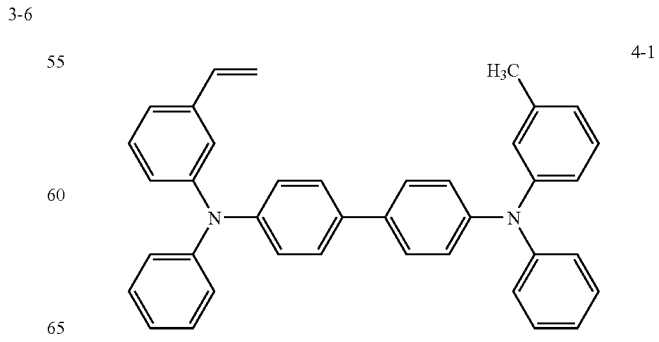

-continued

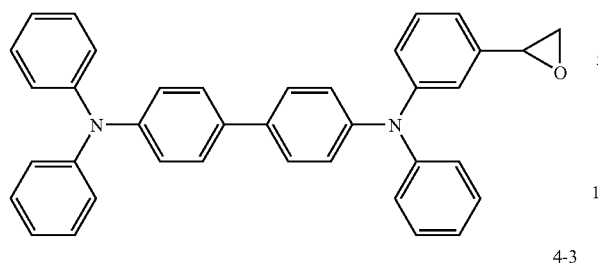
4-2

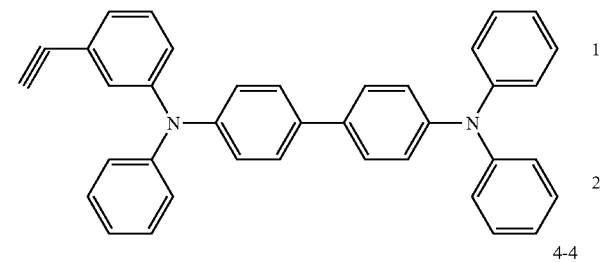
4-3

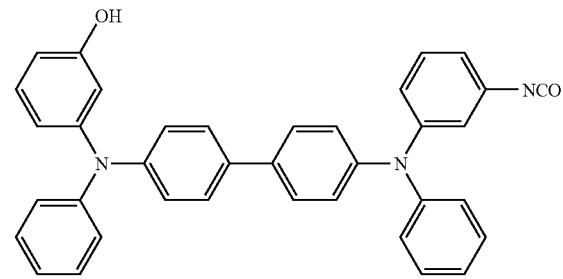
4-4

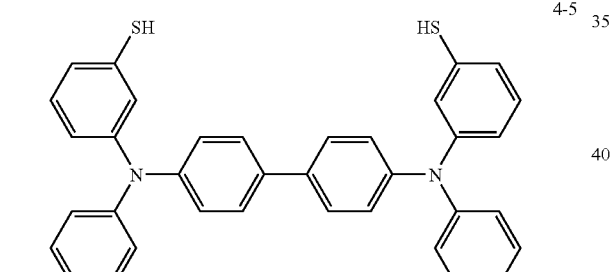
4-5

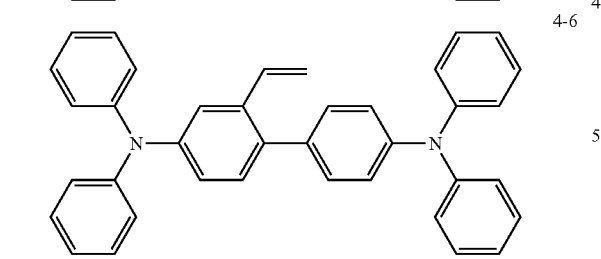
4-6

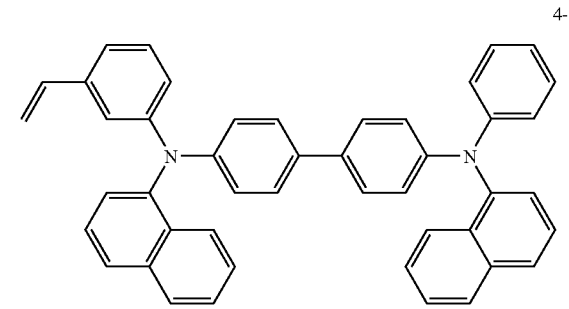
4-7

-continued

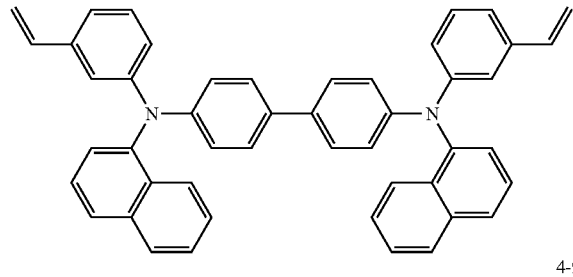
4-8

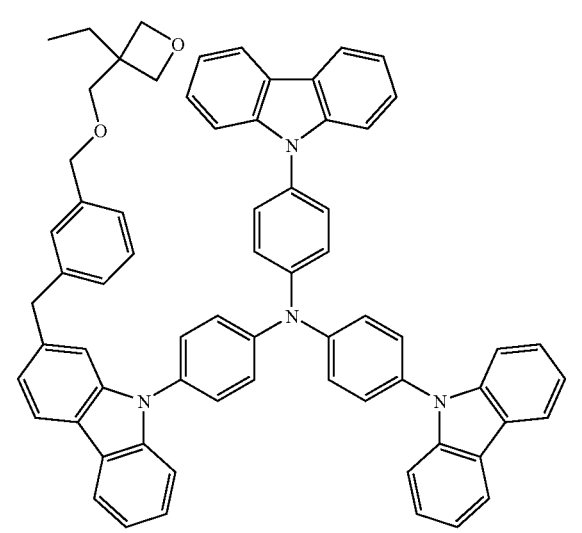
4-9

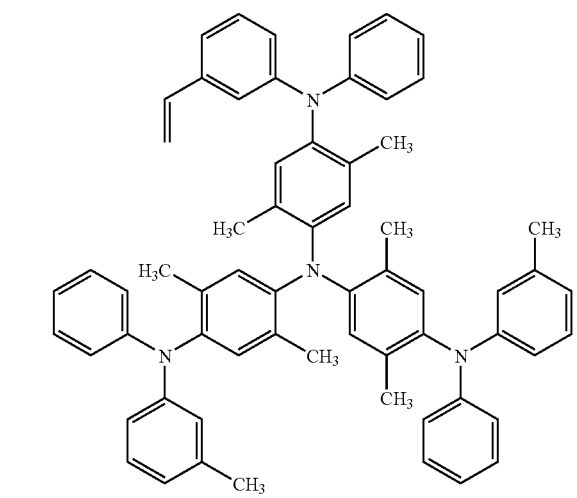
4-10

<Substrate>

A substrate according to an organic EL element of the present invention is not specifically limited with respect to types of such as glass and plastics. They me be transparent or opaque. However, a transparent substrate is preferable when the emitting light is taken from the side of substrate. Substrates preferably utilized includes such as glass, quartz and transparent resin film. A specifically preferable substrate is resin film capable of providing an organic EL element with a flexible property.

Resin film includes such as: polyesters such as polyethylene terephthalate (PET) and polyethylene naphthalate (PEN); polyethylene, polypropyrene; cellulose esters or their derivatives such as cellophane, cellulose diacetate, cellulose triacetate, cellulose acetate butylate, cellulose acetate propionate (CAP), cellulose acetate phthalate (TAC) and cellulose nitrate; polyvinylidene chloride, polyvinyl alcohol, polyethylene vinyl alcohol, syndiotactic polystyrene, polycarbonate, norbornene resin, polymethylpentene, polyether ketone, polyimide, polyether sulfone (PES), polyphenylene sulfide, polysulfones, polyetherimide, polyether ketone imide, polyamide, fluororesin, Nylon, polymethylmethacrylate, acrylic resin, polyacrylate; and cycloolefine resins such as ARTON (produced by JSR Co. Ltd.) and APEL (produce by Mitsui Chemicals, Inc.)

On the surface of a resin film, it may be formed a film incorporating an inorganic or an organic compound or a hybrid film incorporating both compounds. Barrier films are preferable to have a water vapor permeability (25±0.5° C., and relative humidity (90±2) % RH) of at most $1\times10^{-3}$ g/(m$^2$·24 h), determined based on JIS K 7129-1992. Further, high barrier films are preferred at an oxygen permeability of at most $1\times10^{-3}$ ml/(m$^2$·24 h·atm), and at a water vapor permeability (25±0.5° C., and relative humidity (90±2) % RH) of at most $1\times10^{-3}$ g/(m$^2$·24 h), determined based on JIS K 7126-1987.

As materials forming a high barrier film, employed may be those which retard penetration of moisture and oxygen, which deteriorate the element. For example, it is possible to employ silicon oxide, silicon dioxide, and silicon nitride. Further, in order to improve the brittleness of the aforesaid film, it is more preferable to achieve a laminated layer structure of inorganic layers and organic layers. The laminating order of the inorganic layer and the organic layer is not particularly limited, but it is preferable that both are alternatively laminated a plurality of times.

<Formation of a Barrier Film>

Barrier film forming methods are not particularly limited, and examples of employable methods include a vacuum deposition method, a sputtering method, a reactive sputtering method, a molecular beam epitaxy method, a cluster ion beam method, an ion plating method, a plasma polymerization method, a plasma CVD method, a laser CVD method, a thermal CVD method, and a coating method. Of these, specifically preferred is a method employing an atmospheric pressure plasma polymerization method, described in JP-A No. 2004-68143. Examples of opaque support substrates include metal plates such aluminum or stainless steel, films, opaque resin substrates, and ceramic substrates.

The external extraction efficiency of light emitted by the organic EL element of the present invention is preferably at least 1% at room temperature, but is more preferably at least 5%. Here, External extraction quantum yield (%)=(the number of photons emitted by the organic EL element to the exterior/the number of electrons fed to organic EL element)× 100. Further, even by simultaneously employing color hue improving filters such as a color filter, simultaneously employed may be color conversion filters which convert emitted light color from the organic EL element to multicolor by employing fluorescent materials.

<Sealing>

As sealing means employed in the present invention, listed may be, for example, a method in which sealing members, electrodes, and a supporting substrate are subjected to adhesion via adhesives. The sealing members may be arranged to cover the display region of an organic EL element, and may be an engraved plate or a flat plate. Neither transparency nor electrical insulation is limited. Specifically listed examples are glass plates, polymer plate-films, metal plates, and films. Specifically, it is possible to list, as glass plates, soda-lime glass, barium-strontium containing glass, lead glass, aluminosilicate glass, borosilicate glass, bariumborosilicate glass, and quartz.

Further, listed as polymer plates may be polycarbonate, acryl, polyethylene terephthalate, polyether sulfide, and polysulfone. As a metal plate, listed are those composed of at least one metal selected from the group consisting of stainless steel, iron, copper, aluminum magnesium, nickel, zinc, chromium, titanium, molybdenum, silicon, germanium, and tantalum, or alloys thereof.

In the present invention, since it is possible to convert the element to a thin film, it is possible to preferably employ a metal film. Moreover, the polymer films are preferable to have a water vapor permeability (25±0.5° C., and relative humidity (90±2) % RH) of at most $1\times10^{-3}$ g/(m$^2$·24 h), determined based on JIS K 7129-1992. Further, the polymer films are preferable to be a high barrier film having an oxygen permeability of at most $1\times10^{-3}$ ml/(m$^2$·24 h·atm), and at a water vapor permeability (25±0.5° C., and relative humidity (90±2) % RH) of at most $1\times10^{-3}$ g/(m$^2$·24 h), determined based on JIS K 7126-1987.

Conversion of the sealing member into concave is carried out employing a sand blast process or a chemical etching process.

In practice, as adhesives, listed may be photo-curing and heat-curing types having a reactive vinyl group of acrylic acid based oligomers and methacrylic acid, as well as moisture curing types such as 2-cyanoacrylates. Further listed may be thermal and chemical curing types (mixtures of two liquids) such as epoxy based ones. Still further listed may be hot-melt type polyamides, polyesters, and polyolefins. Yet further listed may be cationically curable type ultraviolet radiation curable type epoxy resin adhesives. In addition, since an organic EL element is occasionally deteriorated via a thermal process, those are preferred which enable adhesion and curing between room temperature and 80° C. Further, desiccating agents may be dispersed into the aforesaid adhesives. Adhesives may be applied onto sealing portions via a commercial dispenser or printed on the same in the same manner as screen printing.

Further, it is appropriate that on the outside of the aforesaid electrode which interposes the organic layer and faces the support substrate, the aforesaid electrode and organic layer are covered, and in the form of contact with the support substrate, inorganic and organic material layers are formed as a sealing film. In this case, as materials forming the aforesaid film may be those which exhibit functions to retard penetration of those such as moisture or oxygen which results in deterioration. For example, it is possible to employ silicon oxide, silicon dioxide, and silicon nitride. Still further, in order to improve brittleness of the aforesaid film, it is preferable that a laminated layer structure is formed, which is composed of these inorganic layers and layers composed of organic materials.

Methods to form these films are not particularly limited. It is possible to employ, for example, a vacuum deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a thermal CVD method, and a coating method. In a gas phase and a liquid phase, it is preferable to inject inert gases such as nitrogen or argon, and inactive liquids such as fluorinated hydrocarbon or silicone oil into the space between the sealing member and the surface region of the organic EL element. Further, it is possible to form vacuum. Still further, it is possible to enclose hygroscopic compounds in the interior. Examples of hygroscopic compounds include metal oxides (for example, sodium oxide, potassium oxide, calcium oxide, barium oxide, magnesium oxide, and aluminum oxide); sulfates (for example, sodium sulfate, calcium sulfate, magnesium sulfate, and cobalt sulfate); metal halides (for example, calcium chloride, magnesium chloride, cesium fluoride, tantalum fluoride, cerium bromide, magnesium bromide, barium iodide, and magnesium iodide); perchlorates (for example, barium perchlorate and magnesium perchlorate). In sulfates, metal halides, and perchlorates, suitably employed are anhydrides.

<Protective Film and Protective Plate>

The aforesaid sealing film on the side which nips the organic layer and faces the support substrate or on the outside of the aforesaid sealing film, a protective or a protective plate may be arranged to enhance the mechanical strength of the element. Specifically, when sealing is achieved via the aforesaid sealing film, the resulting mechanical strength is not always high enough, whereby it is preferable to arrange the protective film or the protective plate described above. Usable materials for these include glass plates, polymer plate-films, and metal plate-films which are similar to those employed for the aforesaid sealing. However, in terms of light weight and a decrease in thickness, it is preferable to employ polymer films.

<Anode>

As an anode according to an organic EL element of the present invention, those comprising metal, alloy, a conductive compound, which is provided with a large work function (not less than 4 eV), and a mixture thereof as an electrode substance are preferably utilized. Specific examples of such an electrode substance include a conductive transparent material such as metal like Au, CuI, indium tin oxide (ITO), $SnO_2$ and ZnO. Further, a material such as IDIXO ($In_2O_3$—ZnO), which can prepare an amorphous and transparent electrode, may be also utilized. As for an anode, these electrode substances may be made into a thin layer by a method such as evaporation or spattering and a pattern of a desired form may be formed by means of photolithography, or in the case of requirement of pattern precision is not so severe (not less than 100 µm), a pattern may be formed through a mask of a desired form at the time of evaporation or spattering of the above-described substance. Alternatively, when coatable materials such as organic electrically conductive compounds are employed, it is possible to employ a wet system filming method such as a printing system or a coating system. When emission is taken out of this anode, the transmittance is preferably set to not less than 10% and the sheet resistance as an anode is preferably not more than a few hundreds $\Omega/\square$. Further, although the layer thickness depends on a material, it is generally selected in a range of 10-1,000 nm and preferably of 10-200 nm.

<Cathode>

On the other hand, as a cathode according to the present invention, metal, alloy, a conductive compound and a mixture thereof, which have a small work function (not more than 4 eV), are utilized as an electrode substance. Specific examples of such an electrode substance includes such as sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and rare earth metal. Among them, with respect to an electron injection property and durability against such as oxidation, preferable are a mixture of electron injecting metal with the second metal which is stable metal having a work function larger than electron injecting metal, such as a magnesium/silver mixture, a magnesium/aluminum mixture, a magnesium/indium mixture, an aluminum/aluminum oxide ($Al_2O_3$) mixture and a lithium/aluminum mixture, and aluminum. As for a cathode, these electrode substances may be made into a thin layer by a method such as evaporation or spattering. Further, the sheet resistance as a cathode is preferably not more than a few hundreds $\Omega/\square$ and the layer thickness is generally selected in a range of 10 nm-5 µm and preferably of 50 nm-200 nm. Herein, to transmit emission, either one of an anode or a cathode of an organic EL element is preferably transparent or translucent to improve the emission luminance.

Further, after forming, on the cathode, the above metals at a film thickness of 1-20 nm, it is possible to prepare a transparent or translucent cathode in such a manner that electrically conductive transparent materials are prepared thereon. By applying the above, it is possible to produce an element in which both anode and cathode are transparent.

<Composition of Organic Photoelectric Conversion Element>

As another example of an organic electronic element of the present invention, an organic photoelectric conversion element is cited and it is composed of a substrate (support base), electrodes and organic layers each having various functions. Although examples of a preferable composition are shown below, the present invention is not limited to these.

(11) Anode/electricity generating layer/cathode
(12) Anode/positive hole transport layer/electricity generating layer/cathode
(13) Anode/anode buffer layer/light emitting layer/positive hole inhibition layer/cathode
(14) Anode/positive hole transport layer/$1^{st}$ electricity generating layer/electron transport layer/intermediate electrode/positive hole transport layer/$2^{nd}$ electricity generating layer/positive hole transport layer/cathode
(Notice: Wavelength of absorption light differs between the $1^{st}$ electricity generating layer and the $2^{nd}$ electricity generating layer. A mechanism of organic photoelectric conversion elements composed of the aforesaid layer compositions is described using the element of (11) which has the simplest composition.

The light which enters from the anode (transparent electrode) through the substrate is absorbed in a p-type semiconductor or an n type semiconductor in an electricity generating layer (a bulk hetero junction layer in which a p type organic semiconductor material and an n type organic semiconductor material are mixed uniformly). As a result an electron moves to then type semiconductor from the p-type semiconductor, and the pair (in a charge separation state) of a positive hole and an electron is formed. As for the generated electric charge, an electron passes along between electron acceptors by an internal electric field (for example, in the case where the work functions of a transparent electrode and a counter electrode (cathode) differ, it is a potential difference between a transparent electrode and a counter electrode (a cathode), on the other hand, a positive hole passes along between electron donors, and the electron and the positive hole are carried to a different electrode, respectively, and a photocurrent is detected.

A bulk hetero junction layer is a layer which transforms light energy into electric energy. This layer is a layer in which a p-type semiconductor material and an n type semiconductor material are mixed uniformly. A p-type semiconductor material relatively functions as an electron donor (donor), on the other hand, an n type semiconductor material relatively functions as an electron acceptor (acceptor). Here, an electron donor and an electron acceptor are "the electron donor and the electron acceptor which form the pair (in a charge separation state) of a positive hole and an electron by the effect of moving an electron to an electron acceptor from an electron donor when light is absorbed". The electron donor and the electron acceptor of the present invention do not only supply or receive an electron like an electrode, but they supply or receive an electron as a result of a photo reaction. The p-type semiconductor material and then type semiconductor material which can be used in the present invention are mentioned later.

In addition, there are differences of a HOMO level and a LUMO level between a bulk hetero junction layer and each electrode. These differences may become an obstacle to take out an electric current. Therefore, by providing with a positive hole transport layer and an electron transport layer which have intermediate HOMO or LUMO level so that an electric current may be easily taken out, efficiency can be improved. Namely, as for a positive hole transport layer, it is preferable that it has an intermediate level between the HOMO level of the p type semiconductor layer in the bulk hetero junction layer and the work function of the $1^{st}$ electrode. On the other hand, as for an electron transport layer, it is preferable that it has an intermediate level between the LUMO level of then type semiconductor in the bulk hetero junction layer and the work function of the $2^{nd}$ electrode. Moreover, it may be sufficient to use the electron transport layer which has the above-mentioned hole inhibiting function. Especially, it is preferable to use the compound which has a carboline ring and a diazacarbazole ring.

The positive hole transport layer, the electron transport layer, and the electrodes which are used for these organic photoelectric conversion elements can be formed using the same materials used in the above-mentioned organic electroluminescence element, and the same material.

Furthermore, it is also possible to make a tandem type composition (composition of the above-described (14)) which is formed by laminating such a photoelectric conversion element for the purpose of improvement in sunlight utilization efficiency (photoelectric conversion efficiency).

Moreover, since an organic photoelectric conversion element also deteriorates with oxygen and a water content in the atmosphere, it is desirable that sealing is carried out by the same sealing approach as done for the above-mentioned organic electroluminescence element.

Hereafter, the p-type semiconductor material and n type semiconductor material both of which can be used for the bulk hetero junction layer 14 of the present invention are described.

[P-Type Semiconductor Material]

As a p-type semiconductor material used for the present invention, various condensed polycyclic aromatic compounds and conjugated system polymers are cited.

Examples of a condensed polycyclic aromatic compound include: anthracene, tetracene, pentacene, hexacene, heptacene, chrysene, picene, fulminene, pyrene, peropyrene, perylene, terylene, quoterylene, coronene, ovalene, circumanthracene, bisanthene, zethrene, heptazethrene, pyanthrene, violanthene, isoviolanthene, circobiphenyl, anthradithiophene; and porphyrin, copper phthalocyanine, tetrathiafulvalene (TTF)-tetracyanoquinodimethane (TCNQ) complex, bisethylenetetrathiafulvalene (BEDTTTF)-perchloric acid complex, and these derivatives and precursors.

Moreover, the compounds listed below are examples of a derivative which has the above-mentioned condensed polycyclic rings: a pentacene derivative having a substituent described in WO 03/6599 leaflet, WO 03/28125 leaflet, U.S. Pat. No. 6,690,029, and JP-A No. 2004-107216; a pentacene precursor described in the United States Patent application disclosure 2003/136964; and an acene system compound substituted with a trialkylsilyl ethynyl group described in J. Amer. Chem. Soc., vol. 127, No. 14, 4986, J. Amer. Chem. Soc., vol. 123, 9482, and J. Amer. Chem. Soc., vol. 130 (2008), No. 9, 2706.

Examples of a conjugated system polymer include: polythiophene such as poly 3-hexylthiophene (P3HT) and its oligomer; polythiophene having a polymerizable group described in statement in Technical Digest of the International PVSEC-17, Fukuoka, Japan, 2007, P 1225; polythiophene-thienothiophene copolymer described in Nature Material, (2006) vol. 5, p 328; polythiophene-diketopyrrolopyrrol copolymer described in WO 2008000664; polythiophene-thazolothiazole copolymer described in Adv Mater, 2007, p 4160; polythiophene copolymer such as PCP-DTBT given in Nature Mat., vol. 6 (2007), p. 497; polypyrrole and its oligomer; polyaniline, polyphenylene and thier oligomer; polyphenylene vinylene and its oligomer; polythienylene and its oligomer; polyacethylene, polydiacetylene; and sigma conjugated system polymer such as polysilane or polygermane.

As an oligomer material can be suitable used instead of a polymer material. Examples of an oligomer material include a thiophene hexamer such as: α-sexithionene, α,ω-dihexyl-α-sexithionene, α, ω-dihexyl-α-quinquethionene, and α,ω-bis(3-butoxypropyl)-α-sexithionene.

Among these compounds, a preferable compound has the following properties: the solubility to an organic solvent is high enough to permit applying a solution process; can form a crystalline thin film after drying; and can achieve high mobility.

By using such a compound, even if a bulk hetero junction layer is formed with a solution process, thick layer can be formed, and even if the layer is thick, the diffusion length of a carrier can be more than the layer thickness, and high photoelectric conversion efficiency can be acquired.

[N Type Semiconductor Material]

The organic photoelectric conversion element of the present invention is preferably applied to the bulk hetero junction layer which is formed by mixing an n type semiconductor material and a p-type semiconductor material. As a p-type semiconductor material, it can be used a low molecular weight compound of the present invention. An n type semiconductor material is not specifically limited. Examples of an n type semiconductor material include: fullerene, octazaporphyrin, a perfluoro compound of a p-type semiconductor (perfluoro pentacene and perfluorophthalocyanine), a high molecular compound which contains an aromatic carboxylic acid anhydride and its imide in the structure, such as naphthalenetetracarboxylic anhydride, naphthalenetetracarboxylic diimide, perylenetetracarboxylic anhydride, and perylenetetracarboxylic diimide.

However, when a thiophene containing condensed ring of the present invention is used as a p-type semiconductor material, a fullerene derivative which can perform efficient charge separation is preferably used. Examples of a fullerene derivative include: fullerene $C_{60}$, fullerene $C_{70}$, fullerene $C_{76}$, fullerene $C_{78}$, fullerene $C_{84}$, fullerene $C_{240}$, fullerene $C_{540}$, mixed fullerene, fullerene nano-tube, polylayer fullerene, single layer fullerene, nano-horn (a cone type), as well as their derivative which is substituted with a hydrogen atom, a halogen atom, a substituted or unsubstituted alkyl group, alkenyl group, alkynyl group, aryl group, hetero aryl group, cycloalkyl group, silyl group, ether group, thioether group, amino group or silyl group.

In particular, preferable compounds are the fullerene compounds having am improved solubility by introduction of a substituent. Examples of these are: [6,6]-phenyl C61-butyric acid methyl ester (abbreviated name PCBM), [6,6]-phenyl C61-butyric acid n-butyl ester (PCBnB), [6,6]phenyl C61- butyric acid isobutyl ester (PCBiB), [6,6]-phenyl C61 butyric acid n-hexyl ester (PCBH), bis-PCBM described in Adv. Mater., vol. 20 (2008), p. 2116, aminated fullerene described in JP-A No. 2006-199674, metallocene fullerene described in JP-A No. 2008-130889, and fullerene having a cyclic ether group described in the U.S. Pat. No. 7,329,709.

EXAMPLES

The present invention is specifically described below with reference to examples, but the present invention is not limited to these. In examples, "%" may be used. Unless particularly mentioned, this represents "weight %".

Example 1

Preparation of Organic EL Element 11

(Preparation of Substrate 1)
On a commercially available non-alkali glass substrate was produced 110 nm of ITO with a spattering apparatus as a transparent electrode. Pattering of ITO was performed with a photolithography so that a light emitting portion of 4 mm×4 mm was made. Thus Substrate 1 was prepared.
(Preparation of Organic EL Element 11)
The aforesaid Substrate 1 was subjected to ultrasonic washing with isopropyl alcohol, followed by drying with a desiccated nitrogen gas, and was subjected to UV ozone washing for 5 minutes.

This substrate was installed in a commercially available spin coater and was applied an aqueous solution of PEDOT (Baytron PI14083 made by H. C. Starlk Co., Ltd.) at 4,000 rpm for 30 seconds. Further, this substrate was dried under the atmosphere at 200° C. for 30 minutes to produce a positive hole injection layer. The coating was performed under the same condition on a substrate separately prepared, and the thickness of the film was measured to be 50 nm.

Subsequently, the substrate was transferred under a nitrogen atmosphere into a glove box which has a degree of cleanness of 10 measured based on the method of JIS B9920, a dew point of −80° C. or less, and an oxygen content of 0.8 ppm.

In this glove box, the following coating liquid for a light emitting layer was prepared and it was coated under the condition of 2,000 rpm for 30 seconds with a spin coater to produce a light emitting layer. The coating was performed under the same condition on a substrate separately prepared, and the thickness of the film was measured to be 40 nm.
(Coating Liquid for a Light Emitting Layer)

| Toluene | 100 ml |
|---------|--------|
| H-A     | 1.0 g  |
| Ir-A    | 0.10 g |

Then, the following coating liquid for an electron transport layer was prepared and it was coated under the condition of 1,500 rpm for 30 seconds with a spin coater to produce an electron transport layer. The coating was performed under the same condition on a substrate separately prepared, and the thickness of the film was measured to be 20 nm.
(Coating Liquid for an Electron Transport Layer)

| Methanol | 100 ml |
|----------|--------|
| ET-A     | 0.50 g |

The substrate having been prepared until the electron transport layer was transferred into a vapor deposition apparatus without being exposed to the air and the pressure was reduced to 4×10⁻⁴ Pa. Previously, there have been installed a tantalum resistance heating boat containing lithium fluoride therein and a tungsten resistance heating boat containing aluminium therein in the vapor deposition apparatus.

First, the tantalum resistance heating boat was heated via application of electric current and deposition of lithium fluoride was carried out onto the substrate to form an electron injection layer of lithium fluoride layer having a thickness of 0.5 nm. Then, tantalum heating boat made of tungsten was heated via application of electric current and deposition was carried at a deposition rate of 1 to 2 nm/second to produce a cathode having a thickness of 100 nm.

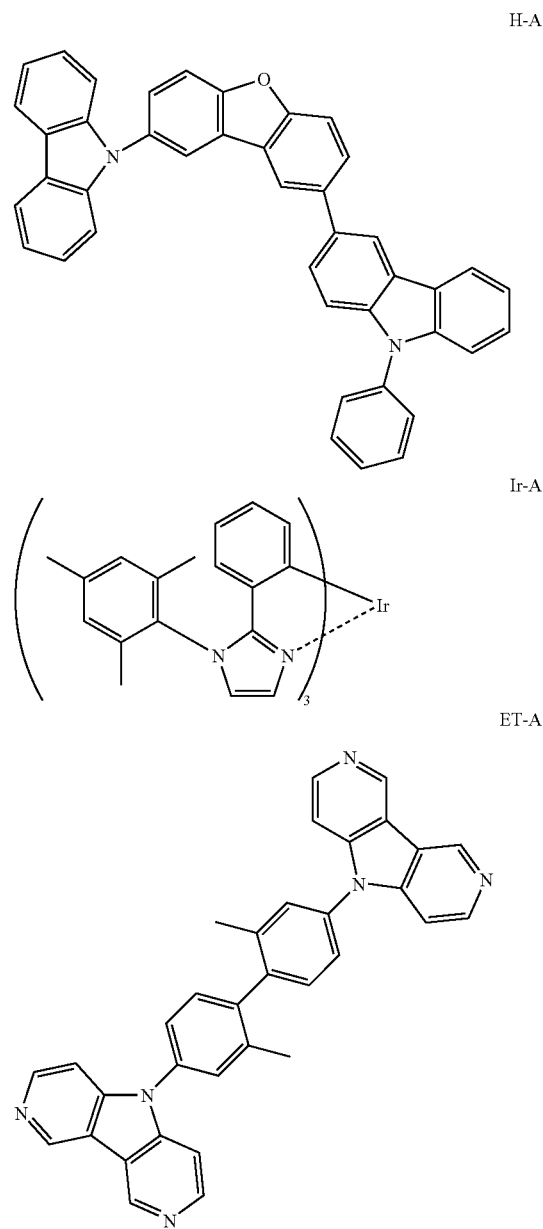

<Preparation of Elements 12 to 15>
Organic EL elements 11 to 15 were prepared in the same manner as preparation of Organic EL element 11, except that the solvent in the coating liquid for the electron transport layer was changed to fluorine containing solvents A to D as are listed in Table 1.

TABLE 1

| No. | Positive hole injection layer | Light emitting layer | Electron transport layer | Electron injection layer | Cathode | Remarks |
|---|---|---|---|---|---|---|
| 11 | PEDOT(50 nm) Coating (water) | Ir-A:H-A(40 nm) Coating (toluene) | ET-A(20 nm) Coating (methanol) | LiF(0.5 nm) Vapor deposition | Al(100 nm) Vapor deposition | Comparison |
| 12 | PEDOT(50 nm) Coating (water) | Ir-A:H-A(40 nm) Coating (toluene) | ET-A(20 nm) Coating (Fluorine containing solvent A) | LiF(0.5 nm) Vapor deposition | Al(100 nm) Vapor deposition | Invention |
| 13 | PEDOT(50 nm) Coating (water) | Ir-A:H-A(40 nm) Coating (toluene) | ET-A(20 nm) Coating (Fluorine containing solvent B) | LiF(0.5 nm) Vapor deposition | Al(100 nm) Vapor deposition | Invention |
| 14 | PEDOT(50 nm) Coating (water) | Ir-A:H-A(40 nm) Coating (toluene) | ET-A(20 nm) Coating (Fluorine containing solvent C) | LiF(0.5 nm) Vapor deposition | Al(100 nm) Vapor deposition | Invention |
| 15 | PEDOT(50 nm) Coating (water) | Ir-A:H-A(40 nm) Coating (toluene) | ET-A(20 nm) Coating (Fluorine containing solvent D) | LiF(0.5 nm) Vapor deposition | Al(100 nm) Vapor deposition | Invention |

PEDOT: Baytron PI4083 made by H. C. Starlk Co., Ltd.
Fluorine containing solvent A: 2,2,3,3-tetrafluoro-1-propanol
Fluorine containing solvent B: 1,1,1,3,3,3-hexafluoro-2-propanol
Fluorine containing solvent C: 2,2,3,4,4,4-hexafluoro-1-butanol
Fluorine containing solvent D: 2,2,3,3,4,4,4-heptafluoro-1-butanol About the produced organic EL elements, the following measurements were performed and their characteristics were evaluated.

<Measurement>

To each Organic EL element was applied a constant direct-current of 25 A/m$^2$ using direct voltage and current source R6243 made by ADC Co., Ltd. A 2-degree view angle front luminance was measured using a spectroradiometric luminance meter CS-1000 (produced by Konica Minolta Sensing Inc.). Electric power efficiency was obtained from the luminance and the electric current density, and the electric current value was measured using the aforesaid R6243.

Each organic element was evaluated by using relative values obtained when the electric current efficiency and the voltage of Organic EL element 11 were respectively set to be 100. The evaluation results are shown in the following table. Here, the classification of A to E each indicates as below.

(Electric Current Efficiency)
A: 130 or more
B: 120 or more to less than 130
C: 110 or more to less than 120
D: 100 or more to less than 110
E: less than 100

(Voltage)
A: less than 80
B: 80 or more to less than 90
C: 90 or more to less than 100
D: 100 or more to less than 110
E: 110 or more Further, magnified observation of the luminescent surface was carried out with a CCD microscope MS-804 made by Moritex Co., Ltd, and emission unevenness was visually evaluated.
A: No emission unevenness is observed
B: Very slight emission unevenness is observed
C: Easily detectable emission unevenness is observed
D: Remarkable emission unevenness is observed.

TABLE 2

| No. | Efficiency | Voltage | Emission unevenness |
|---|---|---|---|
| 11 | D | D | D |
| 12 | B | B | B |
| 13 | B | C | B |
| 14 | B | C | C |
| 15 | B | C | C |

The samples produced by coating the electron transport layer, which is located on the upper layer of the light emitting layer, using a fluorine containing solvent were shown to be superior to the sample produced by coating the electron transport layer using methanol in all of luminous efficiency, driving voltage, and emission unevenness.

Example 2

Organic EL elements 21 to 23 were prepared in the same manner as preparation described in Example 1 and they were evaluated.

Organic EL elements 21 and 22 were prepared in the same manner, except that the coating solvents for the electron transport layer were respectively changed to a mixed solvent of a fluorine containing solvent and acetonitrile (weight ratio=92:8). Organic EL element 23 was prepared in the same manner, except that the following changes were made: a positive hole transport layer was prepared by laminating the following coating liquid for a positive hole transport layer under a nitrogen atmosphere followed by drying at 200° C. for one hour, then it was irradiated with UV rays of 25 mW/cm$^2$ for 180 seconds under a nitrogen atmosphere to carry out photo-polymerization and cross linking to result in curing and obtaining a positive hole transport layer having a thickness of 20 nm; and fluorine containing solvent A was used for the coating solvent for an electron transport layer.

(Coating Liquid for Positive Hole Transport Layer)

| | |
|---|---|
| Toluene | 100 ml |
| HT-A | 0.5 g |

The preparation of samples are summarized in Table 3.

TABLE 3

| No. | Positive hole injection layer | Positive hole transport layer | Light emitting layer | Electron transport layer | Electron injection layer | Cathode | Remarks |
|---|---|---|---|---|---|---|---|
| 21 | PEDOT (50 nm) Coating (water) | None | Ir-A: H-A (40 nm) Coating (toluene) | ET-A (20 nm) Fluorine containing solvent A + acetonitrile | LiF (0.5 nm) Vapor deposition | Al (100 nm) Vapor deposition | Invention |
| 22 | PEDOT (50 nm) Coating (water) | None | Ir-A: H-A (40 nm) Coating (toluene) | ET-A (20 nm) Fluorine containing solvent B + acetonitrile | LiF (0.5 nm) Vapor deposition | Al (100 nm) Vapor deposition | Invention |
| 23 | PEDOT (50 nm) Coating (water) | HT-A (20 nm) Coating (toluene)- Curing | Ir-A: H-A (40 nm) Coating (toluene) | ET-A (20 nm) Fluorine containing solvent A | LiF (0.5 nm) Vapor deposition | Al (100 nm) Vapor deposition | Invention |

HT-A

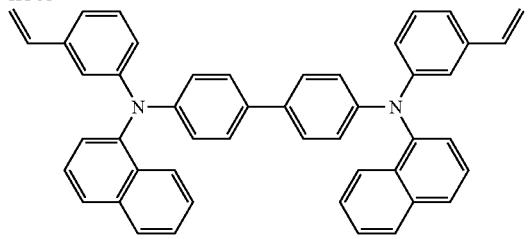 [SMILES: C=Cc1cccc(N(c2ccc(-c3ccc(N(c4cccc(C=C)c4)c4cccc5ccccc45)cc3)cc2)c2cccc3ccccc23)c1]

Organic EL elements 21 to 23 were evaluated in the same manner as described in Example 1.

TABLE 4

| No. | Efficiency | Voltage | Emission unevenness |
|---|---|---|---|
| 21 | B | B | A |
| 22 | B | B | A |
| 23 | A | A | B |

As shown in Table 4, it was demonstrated that the samples produced using a mixed solvent containing a fluorine containing solvent as a coating solvent for an electron transport layer also exhibited excellent properties.

Example 3

Preparation of Comparative Organic Photoelectric Conversion Element 31

After carrying out the same processes for the substrate, cleaning and formation of PEDOT layer formation as done in Example 1, the substrate was transferred under a nitrogen atmosphere into a glove box which has a degree of cleanness of 10 measured based on the method of JIS B9920, a dew point of −80° C. or less, and an oxygen content of 0.8 ppm.

In the glove box, the following coating liquid for a bulk hetero junction layer was prepared and it was coated under the condition of 500 rpm for 60 seconds with a spin coater to produce a bulk hetero junction layer followed by dried at room temperature for 30 minutes.

(Coating Liquid for a Bulk Hetero Junction Layer)

| | |
|---|---|
| Chlorobenzene | 1.0 g |
| Plexcore OS2100 (made by Plextronics, Inc.) | 15 mg |
| PCBM (made by Aldrich Co., Ltd.) | 15 mg |

Subsequently, the following coating liquid for an electron transport layer was prepared and it was coated under the condition of 1,500 rpm for 30 seconds with a spin coater to produce an electron transport layer.

(Coating Liquid for an Electron Transport Layer)

| | |
|---|---|
| Toluene | 1.0 ml |
| ET-A | 2.5 mg |

The substrate having been prepared until the electron transport layer was transferred into a vapor deposition apparatus without being exposed to air and the pressure was reduced to $4\times10^{-4}$ Pa. Previously, in the vapor deposition apparatus, there has been installed a tungsten resistance heating boat containing aluminium therein.

Then, tantalum heating boat made of tungsten was heated via application of electric current and deposition was carried out at a deposition rate of 1 to 2 nm/second to produce a cathode having a thickness of 100 nm.

The obtained Organic photoelectric conversion element 31 was sealed under a nitrogen atmosphere using an aluminium cap and a UV curable resin (UV RESIN XNR5570-B1, made by Nagase Chemtec Co., Ltd)

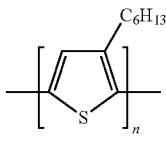

Plexcore OS2100

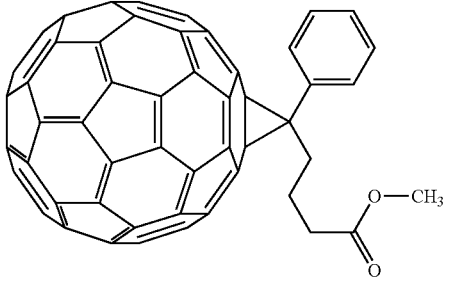

PCBM

<Preparation of Inventive Organic Photoelectric Conversion Elements 32 to 34>

Organic photoelectric conversion elements 32 to 33 were prepared in the same manner as preparation of comparative organic photoelectric conversion element 31, except that the coating solvent for the electron transport layer was changed to the solvents shown in Table 5. Organic photoelectric conversion element 34 was prepared in the same manner as preparation of comparative organic photoelectric conversion element 31, except that the following changes were made: the compound for an electron transport layer was changed to titanium isopropoxide made by Aldrich Co., Ltd.; and the coating solvent was changed to the solvent described in Table 5.

Organic photoelectric conversion elements 31 to 34 thus prepared were taken out in the atmosphere and the light of a solar simulator was irradiated with an irradiation strength of 100 mW/cm$^2$ (AM1.5G). The conversion efficiency was obtained by measuring a voltage-electric current property.

Each organic photoelectric conversion element was evaluated by using relative value obtained when the photoelectric conversion efficiency of Organic photoelectric conversion element 31 was set to be 100. The evaluation results are shown in the following table. Here, the classification of A to E each indicates as below.

(Photoelectric Conversion Efficiency)
A: 200 or more
B: 160 or more to less than 200
C: 130 or more to less than 160
D: 100 or more to less than 130
E: less than 100

TABLE 5

| Organic photoelectric conversion element | Compound for an electron transport layer | Coating solvent | Photoelectric conversion efficiency | Remarks |
| --- | --- | --- | --- | --- |
| 31 | ET-A | Toluene | E | Comparison |
| 32 | ET-A | Fluorine containing solvent A | A | Invention |
| 33 | ET-A | Fluorine containing solvent B | A | Invention |
| 34 | Titanium isopropoxide | Fluorine containing solvent A | B | Invention |

As are shown in Table 5, it was demonstrated that the samples produced using a mixed solvent containing a fluorine containing solvent as a coating solvent for an electron transport layer exhibited excellent properties.

The invention claimed is:

1. A method for producing an organic electronic element comprising the step of:
    forming functional layers by laminating an organic layer A on a substrate followed by laminating an organic layer B on the organic layer A, wherein the organic layer B is formed by coating using a fluorine containing solvent after the organic layer A is formed, the organic layer A is a light emitting layer that contains a light emitting compound having a molecular weight of 2,000 or less, wherein the fluorine containing solvent is a fluorine containing alcohol selected from the group consisting of 2,2,3,3,3-tetrafluoropropanol, 2,2,3,3,3-pentafluoropropanol, 2-trifluoromethyl-2-propanol, 2,2,3,3,4,4-hexafluorobutanol, 2,2,3,3,4,4,5,5-octafluoropentanol, 1,1,1,3,3,3-hexafluoro-1-propanol, 2,2,2-trifluoro-1-ethanol, 2,3-difluorobenzylalcohol, 2,2,2-trifluoroethanol, 1,3-difluoro-2-propanol, 1,1,1-trifluoro-2-propanol, 3,3,3-trifluoro-1-propanol, 2,2,3,3,4,4,4-heptafluoro-1-butanol, 2,2,3,3,4,4,5,5-octafluoro-1-pentanol, 3,3,4,4,5,5,5-heptafluoro-2-pentanol, 2,2,3,3,4,4,5,5,6,6,7,7,8,8,8-pentadecafluoro-1-octanol, 3,3,4,4,5,5,6,6,7,7,8,8,8-tridecafluoro-1-octanol, 1H,1H,9H-perfluoro-1-nonanol, 1H,1H,2H,3H,3H,-perfluorononane-1,2-diol, 1H,1H,2H,2H-perfluoro-1-decanol, 1H,1H,2H,3H,3H-perfluoroundecane-1,2-diol, and mixtures thereof, and
    the organic layer B is an electron transport layer.

2. The method for producing an organic electronic element of claim 1, wherein the light emitting layer is formed by coating using a non-polar solvent.

3. The method for producing an organic electronic element of claim 1, wherein the light emitting layer contains a phosphorescence emitting compound.

4. The method for producing an organic electronic element of claim 1, wherein the fluorine containing solvent is used by mixing with a polar solvent containing no fluorine atom.

5. The method for producing an organic electronic element of claim 1, wherein at least one cross-linked organic layer is provided prior to coating the organic layer B using a fluorine containing solvent.

6. The method for producing an organic electronic element of claim 1, wherein a metal layer or a metal compound layer is laminated on the organic layer B formed by coating using a fluorine containing solvent.

7. The method for producing an organic electronic element of claim 1, wherein the organic electronic element is a photoelectric conversion element, and the organic layer A is a bulk hetero junction layer.

8. The method for producing an organic electronic element of claim 7, wherein the bulk hetero junction layer is formed by coating using a non-polar solvent.

9. The method for producing an organic electronic element of claim 7, wherein the organic layer B is an electron transport layer.

10. The method for producing an organic electronic element of claim 7, wherein the organic layer B contains a compound having a carboline ring or a carbazole ring.

* * * * *

UNITED STATES PATENT AND TRADEMARK OFFICE
CERTIFICATE OF CORRECTION

PATENT NO.        : 8,569,087 B2                                            Page 1 of 1
APPLICATION NO.   : 12/741704
DATED             : October 29, 2013
INVENTOR(S)       : Shigeru Kojima, Kunimasa Hiyama and Hideo Taka It is certified that error appears in the above-identified patent and that said Letters Patent is hereby corrected as shown below:

In the Claims:

Claim 1, column 62, line 8 "2,2,3,3,3-tetrafluoropropanol" should be changed to
--2,2,3,3-tetrafluoropropanol--.

Claim 1, column 62, line 11 "1,1,1,3,3,3-hexafluoro-1-propanol" should be changed to
--1,1,1,3,3,3-hexafluoro-2-propanol--.

Signed and Sealed this
Twenty-fifth Day of February, 2014

Michelle K. Lee
*Deputy Director of the United States Patent and Trademark Office*